(12) United States Patent
Araki et al.

(10) Patent No.: US 8,698,228 B2
(45) Date of Patent: *Apr. 15, 2014

(54) NON-VOLATILE MEMORY DEVICE AND METHOD FOR MANUFACTURING THE SAME

(75) Inventors: Takeshi Araki, Tokyo (JP); Takeshi Yamaguchi, Kanagawa-ken (JP); Mariko Hayashi, Tokyo (JP); Kohichi Kubo, Kanagawa-ken (JP); Takayuki Tsukamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 806 days.

This patent is subject to a terminal disclaimer.

(21) Appl. No.: 12/886,202

(22) Filed: Sep. 20, 2010

(65) Prior Publication Data

US 2011/0057246 A1  Mar. 10, 2011

Related U.S. Application Data

(63) Continuation of application No. PCT/JP2008/056715, filed on Apr. 3, 2008.

(51) Int. Cl.
*H01L 29/792* (2006.01)

(52) U.S. Cl.
USPC ............................. 257/324; 438/216; 438/287

(58) Field of Classification Search
CPC ............................. H01L 29/792; H01L 29/804
USPC ........... 257/324, E21.657, E21.659, E29.309, 257/E27.026, E21.423, E21.679; 438/216, 438/287
See application file for complete search history.

(56) References Cited

U.S. PATENT DOCUMENTS 6,690,601 B2 *   2/2004   Yeh et al. ................. 365/185.28
7,619,270 B2 *  11/2009   Chindalore et al. .......... 257/296
(Continued)

FOREIGN PATENT DOCUMENTS

JP    2006-74028    3/2006
JP    2006-203178   8/2006
(Continued)

OTHER PUBLICATIONS

Yasuhiro Iijima et al., "Reel to Reel Continuous Formation of Y-123 Coated Conductors by IBAD and LPLD Method", IEEE Transactions on Applied Superconductivity, vol. 11, No. 1, Mar. 2001, pp. 2816-2821 (with Statement of Relevancy, the reference was submitted on Sep. 20, 2010).

(Continued)

*Primary Examiner* — Khiem D Nguyen
(74) *Attorney, Agent, or Firm* — Oblon, Spivak, McClelland, Maier & Neustadt, L.L.P.

(57) ABSTRACT

According to one embodiment, a non-volatile memory device includes a stacked structure and a voltage application portion. The stacked structure includes a memory portion, and an electrode stacked with the memory portion and having a surface having a portion facing the memory portion. The voltage application portion applies a voltage to the memory portion to cause a change in a resistance in the memory portion to store information. The surface includes a first region and a second region. The first region contains at least one of a metallic element, Si, Ga, and As. The first region is conductive. The second region contains at least one of the metallic element, Si, Ga, and As, and has a content ratio of nonmetallic element higher than a content ratio of nonmetallic element in the first region. At least one of the first region and the second region has an anisotropic shape on the surface.

16 Claims, 15 Drawing Sheets

(56) References Cited

U.S. PATENT DOCUMENTS

| | | |
|---|---|---|
| 8,410,540 B2 * | 4/2013 | Araki et al. .................. 257/324 |
| 2006/0046509 A1 | 3/2006 | Gwan-Hyeob |
| 2006/0160304 A1 | 7/2006 | Hsu et al. |
| 2007/0018207 A1 * | 1/2007 | Prinz ............................ 257/288 |
| 2007/0097737 A1 | 5/2007 | Asano et al. |
| 2007/0097738 A1 | 5/2007 | Asano et al. |
| 2007/0145346 A1 | 6/2007 | Seidi |

FOREIGN PATENT DOCUMENTS

| | | |
|---|---|---|
| JP | 2006-287222 | 10/2006 |
| JP | 2007-129199 | 5/2007 |
| JP | 2007-129200 | 5/2007 |
| JP | 2007-273618 | 10/2007 |
| WO | WO 2004/008535 A1 | 1/2004 |
| WO | WO 2007/125674 A1 | 8/2007 |

OTHER PUBLICATIONS

Yasuhiro Iijima et al., "Reel to Reel Continuous Formation of Y-123 Coated Conductors by IBAD and LPLD Method", IEEE Transactions on Applied Superconductivity, vol. 11, No. 1, Mar. 2001, pp. 2816-2821.

A. Goyal et al., "High critical current density superconducting tapes by epitaxial deposition of $YBa_2Cu_3O_x$ thick films on biaxially textured metals", Applied Physics Letters, vol. 69, No. 12, Sep. 16, 1996, pp. 1795-1797.

Japanese Office Action issued Mar. 21, 2013 in Patent Application No. 2010-505239 with English Translation.

Japanese Office Action issued May 28, 2013, in Japan Patent Application No. 2010-505239 (with English translation).

* cited by examiner ent higher than a content ratio of nonmetallic element in the first region. At least one of the first region and the second regions has an anisotropic shape on the surface.

NON-VOLATILE MEMORY DEVICE AND METHOD FOR MANUFACTURING THE SAME

CROSS-REFERENCE TO RELATED APPLICATIONS

This is a continuation application of International Application PCT/JP2008/056715, filed on Apr. 3, 2008; the entire contents of which are incorporated herein by reference.

FIELD

Embodiments described herein relate generally to a non-volatile memory device and a method for manufacturing the same.

BACKGROUND

In recent years, there has been drastic progress in high-speed information transmission networks along with worldwide diffusion of small portable devices. Under these circumstances, demands for small non-volatile memories of large capacities are increasing rapidly. Among them, NAND flash memories and small HDDs (hard disk drives), in particular, have made rapid progress in recording density and are used for various purposes such as memories for mobile music markets, memories for recording portable games, memory devices for personal computers, and so forth. However, it is said that these non-volatile memories have limitations in the degree of high-density recording.

Against this background, various memories have been proposed as next-generation non-volatile memory devices including one utilizing a phase change, one utilizing a magnetic change, one utilizing a ferroelectric substance, one utilizing a resistance change, and so forth. Among them, a resistance change type memory or a so-called ReRAM (resistive random access memory) is highly expected for reduction in power consumption and drastic improvement in read/write speed as compared to conventional memories by virtue of microfabrication.

A resistance change type material which is to serve as a memory portion is located between two electrodes in this ReRAM. It is important to realize an oriented structure of the memory portion in order to improve durability and characteristics of the ReRAM.

Such electrodes typically are formed of an electrically isotropic metal, a single crystal substance such as Si, or a metal compound in a similar state. On the other hand, such a memory portion is typically formed of an oxide layer having a polarity. Therefore, it is essential to orient the metal oxide or the like having electrical polarity on the nearly electrically isotropic electrodes, while maintaining conductivity between the electrodes and the memory portion. However, there are no conventional techniques known to achieve this configuration. Accordingly, in the conventional ReRAM, the memory portion is less oriented, resulting in poor durability and performance.

DETAILED DESCRIPTION

Figure 1:
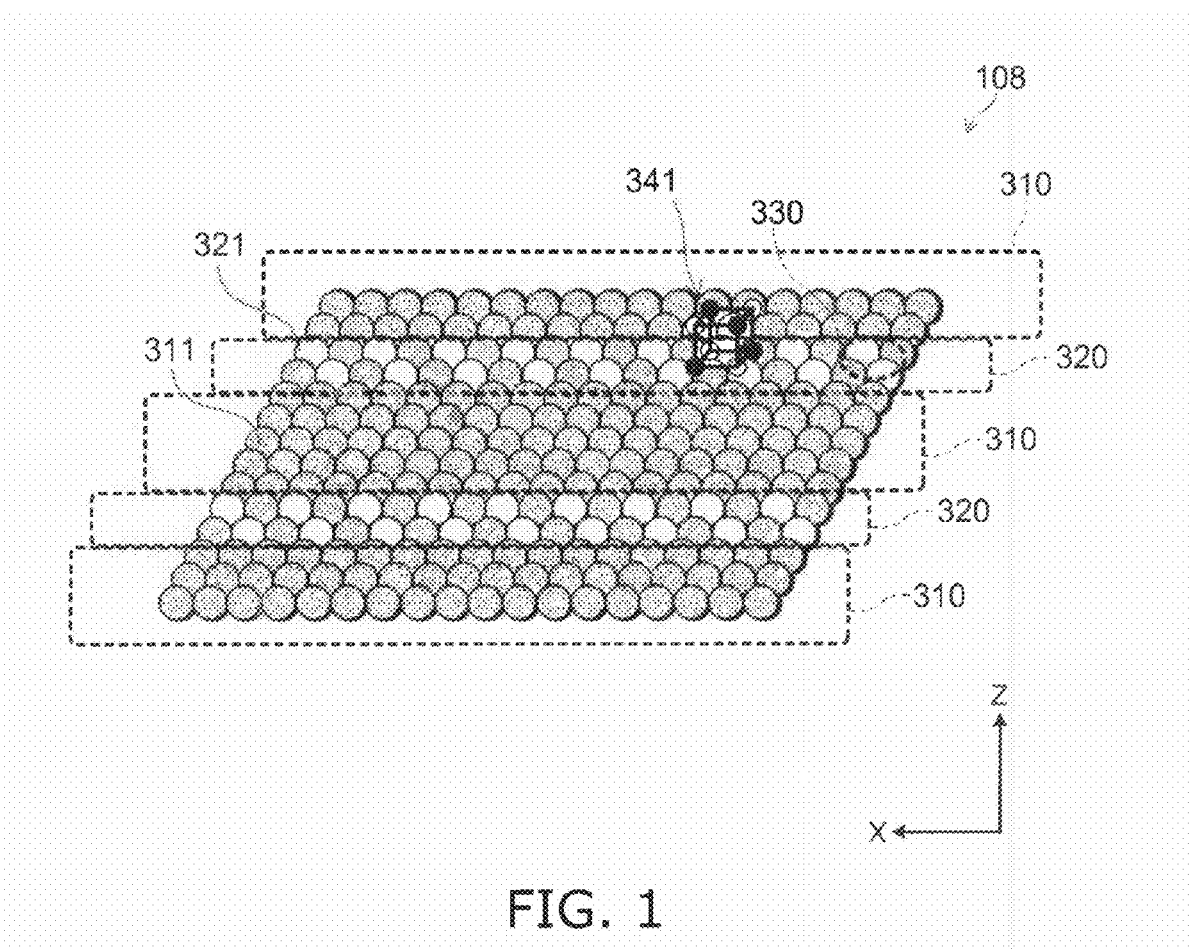
FIG. 1 is a conceptual diagram illustrating the configuration of substantial part of a non-volatile memory device according to a first embodiment.

In general, according to one embodiment, a non-volatile memory device includes a stacked structure and a voltage application portion. The stacked structure includes a memory portion, and an electrode stacked with the memory portion and having a surface having a portion facing the memory portion. The voltage application portion is configured to apply a voltage to the memory portion to cause a change in a resistance in the memory portion to store information. The surface includes a first region and a second region. The first region contains at least one of a metallic element, Si, Ga, and As. The first region is conductive. The second region contains at least one of the metallic element, Si, Ga, and As. The second region has a content ratio of nonmetallic element higher than a content ratio of nonmetallic element in the first region. At least one of the first region and the second region has an anisotropic shape on the surface.

According to one embodiment, a non-volatile memory device includes a stacked structure and a voltage application portion. The stacked structure includes a memory portion, and an electrode stacked with the memory portion and having a surface having a portion facing the memory portion. The voltage application portion is configured to apply a voltage to the memory portion to cause a change in a resistance in the memory portion to store information. The surface includes a first region and a plurality of second regions. The first region contains at least one of a metallic element, Si, Ga, and As. The first region is conductive. The plurality of second regions contain at least one of the metallic element, Si, Ga, and As. The second regions have a content ratio of nonmetallic element higher than a content ratio of nonmetallic element in the first region. A layout of the plurality of second regions has anisotropy.

According to one embodiment, a non-volatile memory device includes a stacked structure and a voltage application portion. The stacked structure includes a memory portion, and an electrode stacked with the memory portion and having an interface facing the memory portion. The voltage application portion is configured to apply a voltage to the memory portion to cause a change in a resistance in the memory portion to store information. The interface includes a nonmetallic element, and at least one of a metallic element, Si, Ga, and As. A polarization length is defined as a distance twice as long as a distance between the metallic element and the nonmetallic element in a polarization pair formed of a pair of the metallic element and the nonmetallic element adjacent to each other on the interface. A polarization pair region is defined as a region containing another polarization pair existing within a range of the polarization length viewed from an end of the polarization pair. R (%) is defined as an area ratio of the polarization pair region to the interface. The memory portion includes an orientation improved region which is provided above the polarization pair region and has an orientation property higher than an orientation property in other region than the orientation improved region. The outer periphery of the orientation improved region in a plane at a distance of T (nm) above from the interface toward the memory portion is located at a distance not less than 12T outside of an outer periphery of the polarization pair region on the interface. An area of the orientation improved region in the plane at the distance of T (nm) is not less than {R+(100−R)/2} (%) of an area of the interface.

According to one embodiment, a method for manufacturing a non-volatile memory device is disclosed. The device includes a stacked structure and a voltage application portion. The stacked structure includes a memory portion and an electrode. The electrode is stacked with the memory portion and contains at least one of a metallic element, Si, Ga, and As. The voltage application portion is configured to apply a voltage to the memory portion to cause a change in a resistance in the memory portion to store information. The method can include forming a first region and a second region on a surface of a conductive layer serving as the electrode. At least a part of the surface is to face the memory portion. The first region is conductive. The second region has content ratio of nonmetallic element higher than a content ratio of a nonmetallic element in the first region and has an anisotropic shape on the surface. In addition, the method can include forming a layer serving as the memory portion on the first region and the second region.

According to one embodiment, a method for manufacturing a non-volatile memory device is disclosed. The device includes a stacked structure and a voltage application portion. The stacked structure includes a memory portion and an electrode. The electrode is stacked with the memory portion and contains at least one of a metallic element, Si, Ga, and As. The voltage application portion is configured to apply a voltage to the memory portion to cause a change in a resistance in the memory portion to store information. The method can includes forming a first region and a plurality of second regions on a surface of a conductive layer serving as the electrode. At least a part of the surface is to face the memory portion. The first region is conductive. Each of the second regions has a content ratio of a nonmetallic element higher than a content ratio of a nonmetallic element in a first region. The second regions are arranged in an anisotropic layout on the surface. In addition, the method can include forming a layer serving as the memory portion on the first region and the second regions.

Now, embodiments will be described below in detail with reference to the accompanying drawings.

It is to be noted that the drawings are merely schematic and conceptual. Accordingly, relations between the thickness and the width of each portion, proportions in size among portions, and other factors are not always the same as those in reality. Moreover, the same portion may be expressed by using different dimensions or proportions in different drawings.

Throughout this specification and the drawings, constituents described earlier with other drawings are designated by the same reference numerals, and detailed description thereof will be omitted as appropriate.

First Embodiment

FIG. 1 is a conceptual diagram illustrating the configuration of substantial part of a non-volatile memory device according to a first embodiment.

FIGS. 2A to 3C are schematic diagrams illustrating the configuration of the non-volatile memory device according to the first embodiment.

Figure 2A:
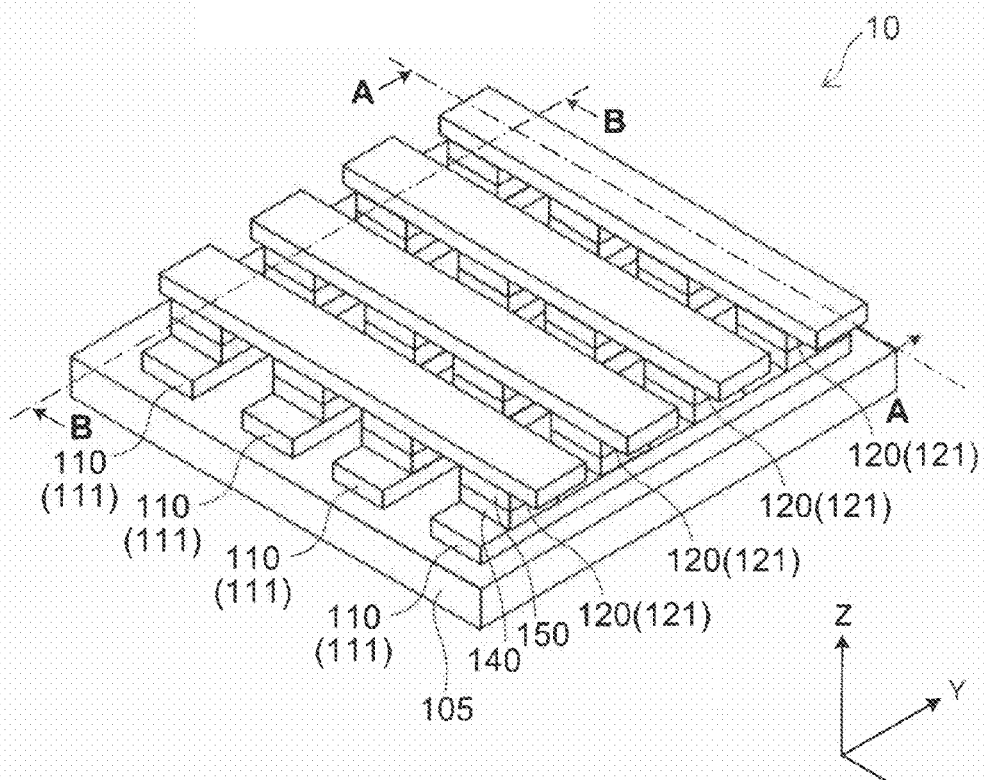
FIGS. 2A to 3C are schematic diagrams illustrating the configuration of the non-volatile memory device according to the first embodiment.
Figure 2B:
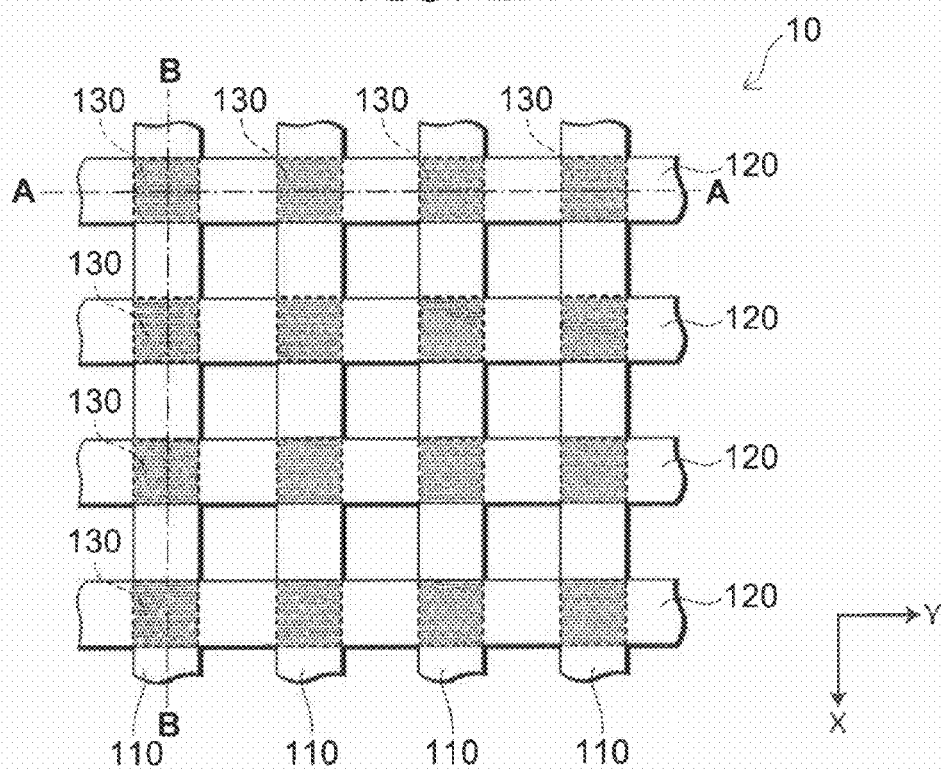
Figure 3A:
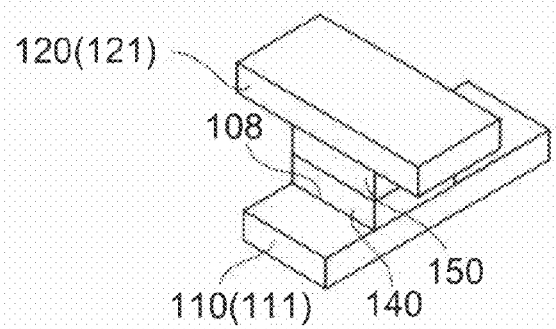
Figure 3B:
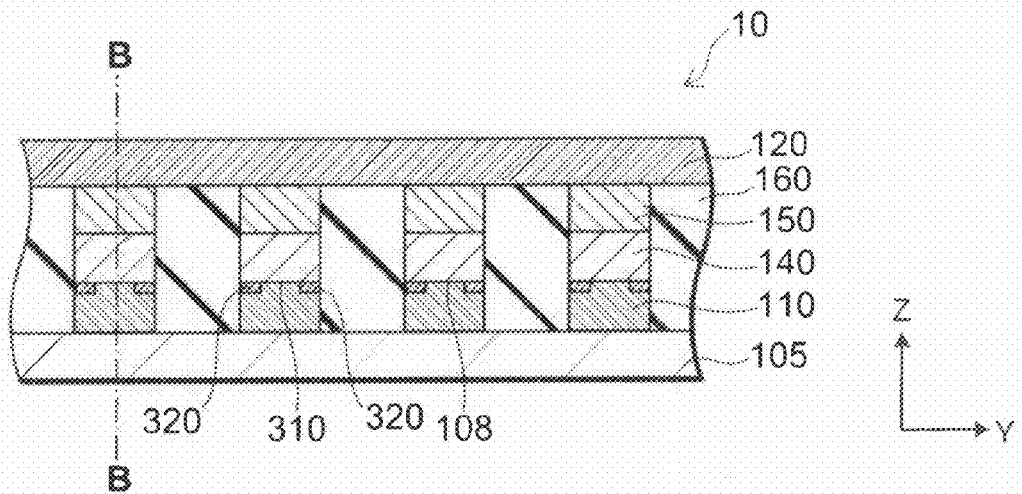
Figure 3C:
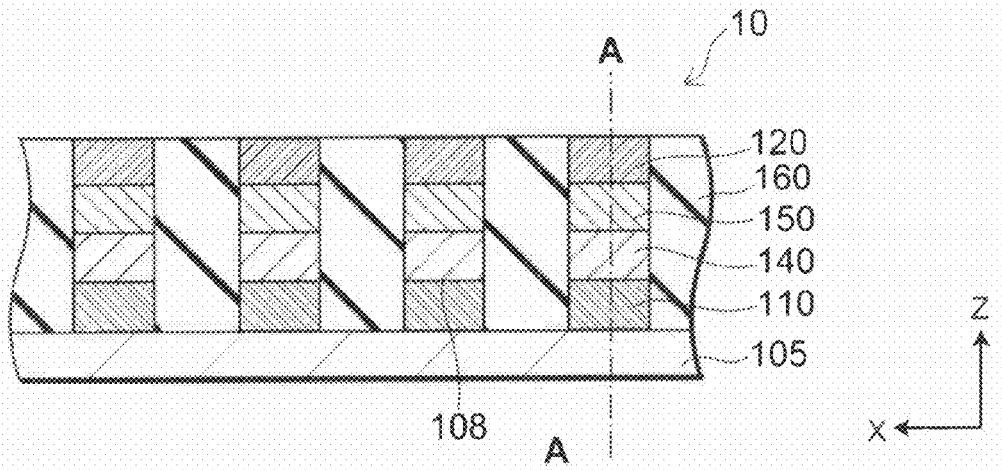

Specifically, FIG. 2A is a schematic perspective view, FIG. 2B is a plan view, FIG. 3A is a schematic perspective view of substantial part, FIG. 3B is a cross-sectional view taken along an A-A line in FIGS. 2A and 2B, and FIG. 3C is a cross-sectional view taken along a B-B line in FIGS. 2A and 2B.

Figure 4A:
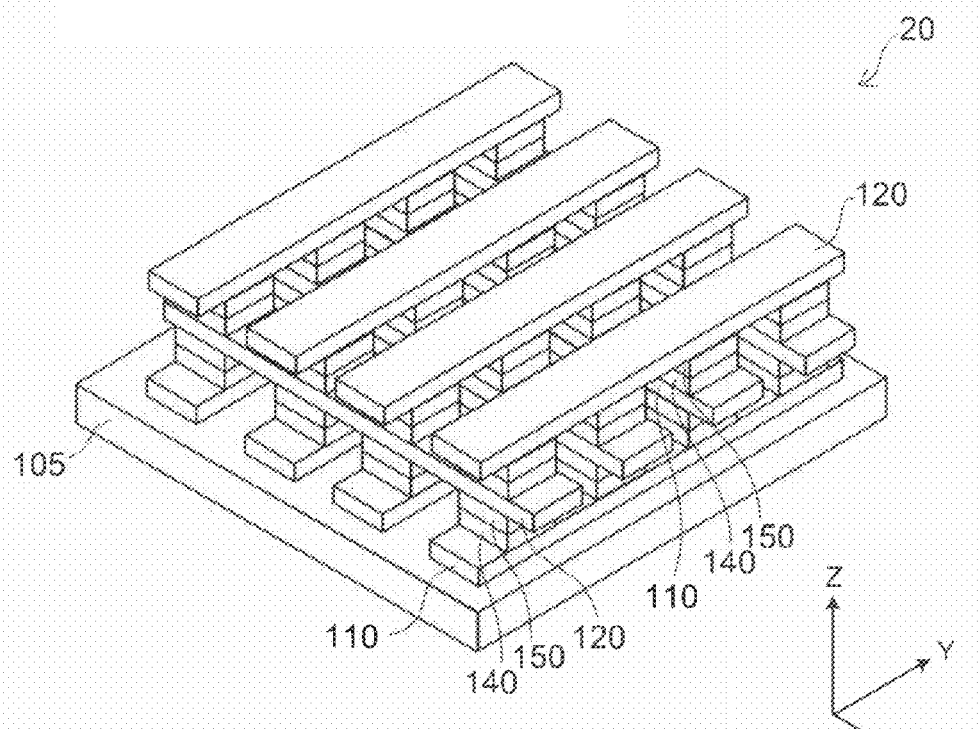
FIGS. 4A and 4B are schematic perspective views illustrating the configuration of another non-volatile memory device according to the first embodiment.
Figure 4B:
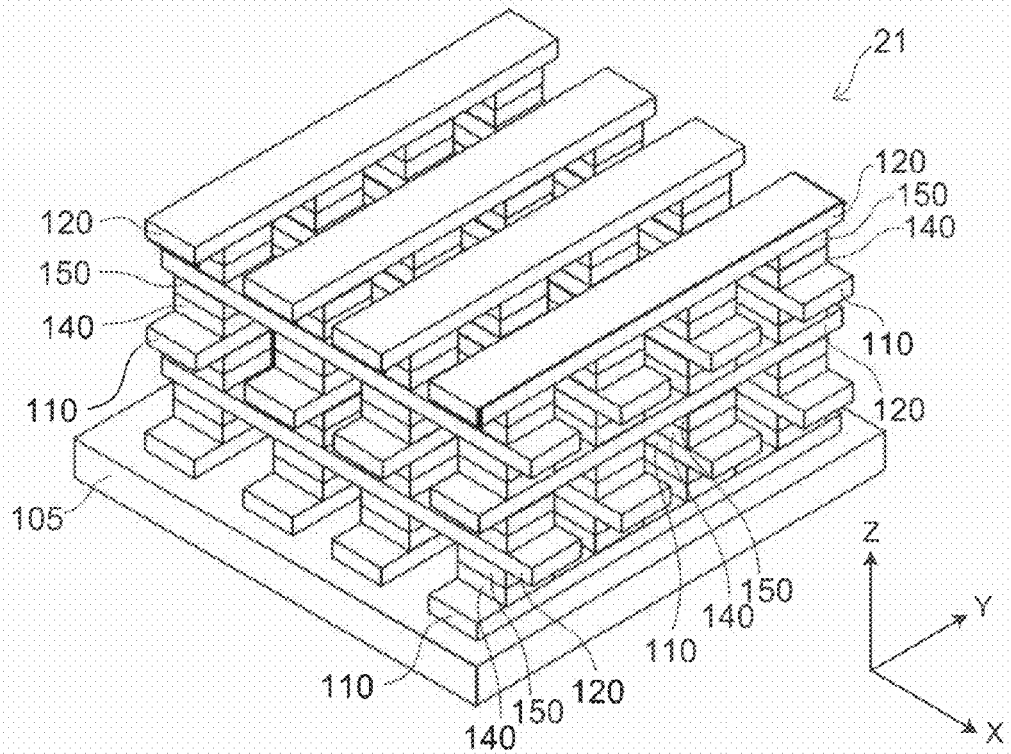

FIGS. 4A and 4B are schematic perspective views illustrating the configuration of another non-volatile memory device according to the first embodiment.

Figure 5:
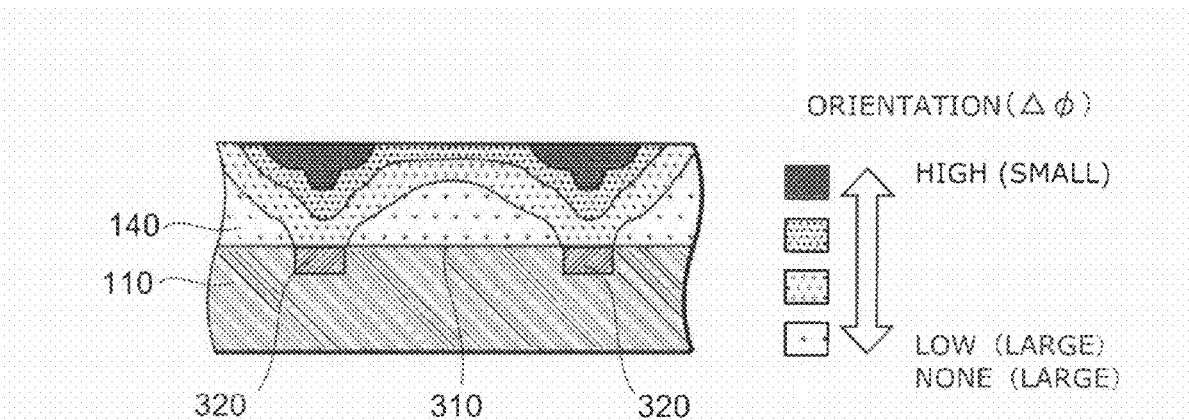
FIG. 5 is a schematic cross-sectional view illustrating an oriented state in the non-volatile memory device according to the first embodiment.

FIG. 5 is a schematic cross-sectional view illustrating an oriented state in the non-volatile memory device according to the first embodiment.

Figures 6A, 6B:
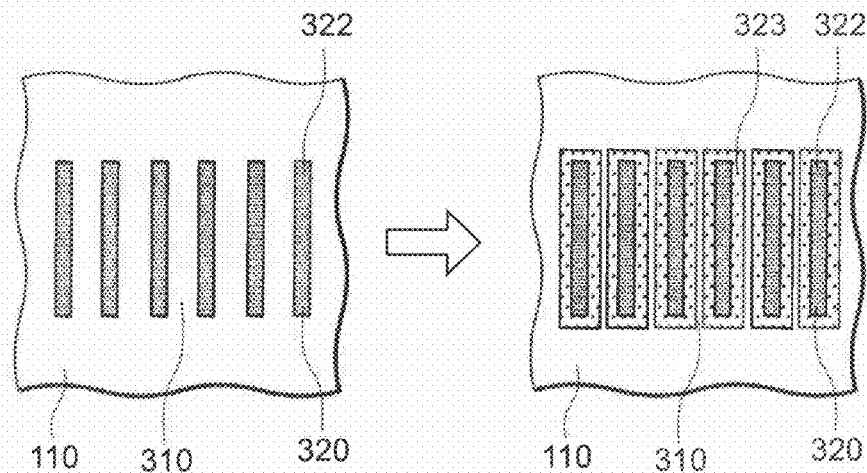
FIGS. 6A and 6B are schematic plan views illustrating a state of polarization pairs in the non-volatile memory device according to the first embodiment.

FIGS. 6A and 6B are schematic plan views illustrating a state of polarization pairs in the non-volatile memory device according to the first embodiment.

A non-volatile memory device according to a first embodiment is a cross point type non-volatile memory device.

First, an outline of a configuration of the non-volatile memory device of this embodiment will be described with reference to FIGS. 2A to 3C. As shown in FIGS. 2A and 2B, in a non-volatile memory device 10 of the first embodiment, strip-shaped first electrodes 110 (electrodes 111) extending in an x-axis direction are provided on a principal surface of a substrate 105. Moreover, strip-shaped second electrodes 120 extending in a y-axis direction orthogonal to the x-axis direction on a plane parallel to the substrate 105 are provided so as to face the first electrodes 110.

Although the above-described configuration shows an example of arranging the first electrode 110 and the second electrode 120 orthogonal to each other, the first electrode 110 and the second electrode 120 are arranged so as to intersect each other (nonparallel).

FIGS. 2A and 2B show the example of providing four first electrodes 110 and four second electrodes 120, respectively. However, the embodiments are not limited only to the foregoing and it is possible to provide arbitrary numbers of the first electrodes 110 and the second electrodes 120. Moreover, for example, the first electrodes 110 are referred to as bit lines (BL) and the second electrodes 120 are referred to as word lines (WL), respectively. However, in this case, it is also possible to define the first electrodes 110 as the word lines (WL) and the second electrodes 120 as the bit lines (BL).

Moreover, a memory portion 140 is interposed between the first electrode 110 and the second electrode 120. Specifically, in the non-volatile memory device 10, the memory portion 140 is provided at an intersection 130 (cross point) formed by a three-dimensional intersection of the bit line and the word line. Further, a voltage to be applied to each memory portion 140 is changed depending on a combination of electric potential supplied to the first electrode and electric potential supplied to the second electrode 120 so that the memory portion 140 can store information according to a characteristic of the memory portion at that point. Here, a switching element 150 having a rectifying to property may be provided, for example, to impart directionality to the polarity of the voltage to be applied to the memory portion 140. The switching element 150 may apply a PIN diode or a MIM (metal-insulator-metal) element, for example. Note that the switching element 150 may be provided in a region other than the region where the first electrode 110 and the second electrode 120 face each other.

The substrate 105 may apply a silicon substrate, for example, and may be provided with a driving circuit to drive the non-volatile memory device.

The first electrodes 110 and the second electrodes 120 may apply various conductive materials containing metallic elements. These electrode materials will be described later in detail.

Meanwhile, the memory portions 140 may apply materials which change electric resistance values depending on a voltage or a current to be applied thereto, such as nickel oxide ($NiO_x$), titanium oxide ($TiO_x$), $ZnMn_2O_4$ or $Pr_xCa_{1-x}MnO_3$. However, the embodiments are not limited only to the foregoing and the memory portions 140 may apply all materials which exhibit the resistance change.

As described above, the non-volatile memory device 10 according to this embodiment includes a stacked structure having the electrodes 111 (the first electrodes 110) and the memory portions 140 provided on the electrodes 111, as well as voltage application portions 121 (the second electrodes 120) configured to apply voltage to the memory portions 140 so as to change a resistance in the memory portion to store information. For example, the electrodes 111 (the first electrode 110) extend in a first direction. The voltage application portions 121 (the second electrodes 120) extend a second direction intersecting the first direction. The memory portions 140 are interposed between the electrodes 141 and the voltage application portion 121. The electrode 111 functions as one of a word line and a bit line. The voltage application portion 121 functions as another one of the word line and the bit line.

As shown in FIGS. 2A and 3A, the memory portion 140 is provided in a region between the first electrode 110 and the second electrode 120, the region formed by a three-dimensional intersection of the two electrodes. A single memory portion 140 constitutes one element which is called a cell. Moreover, the memory portion 140 is provided so as to contact a surface of the first electrode 110 facing the memory portion 140. i.e., an electrode surface 108.

Meanwhile, as shown in FIGS. 3B and 3C, the first electrodes 110, the second electrodes 120, and the memory portions 140 define multiple regions spaced at intervals, and insulators 160 are provided between those multiple regions. Note that the insulators 160 are omitted in FIGS. 2A, 2B, and 3A.

These insulators 160 may apply silicon oxide ($SiO_2$) having high electric resistance, for example. However, without limitation to the foregoing, the insulators 160 may apply various materials having higher electric resistance than the memory portions 140.

Meanwhile, as shown in FIG. 3B, the surface of the first electrode 110 (the electrode surface 108) facing the memory portion 140 is provided with a first region 310 and a second region 320 to be described later. Note that the first region 310 and the second region 320 are omitted in FIGS. 2A, 2B, and 3A.

FIGS. 2A to 3C illustrate only the one-layer stacked structure formed by stacking the first electrodes 110, the second electrodes 120, and the memory portions 140 located therebetween. However, it is possible to construct a high-density memory device by stacking a large number of this stacked structure on top of one another.

Specifically, it is possible to form a two-layered stacked structure such as a non-volatile memory device 20 as exemplified in FIG. 4A, a four-layered stacked structure such as a non-volatile memory device 21 as exemplified in FIG. 4B, and a stacked structure having even more layers.

In the non-volatile memory device 10 of this embodiment, the surface of the first electrode 110 which faces the memory portion 140 or, namely, the electrode surface 108 includes a first region 310 containing an element possessing and developing conductivity (i.e., at least any one element out of metallic elements, Si, Ga, and As) as shown in FIG. 1. In the following, such an element developing conductivity will be simply referred to as a metallic element 311 for simplifying explanation.

This metallic element 311 is configured to impart conductivity to at least the electrode surface 108 of the first electrode 110, which may apply at least one element selected from the group consisting of Ti, Ta, Zr, Hf, W, Mo, Ni, Pt, Er, Ir, Ru, Au, Nb, Sr, Si, Ga, and As. In addition, the metallic element 311 may apply an alloy containing at least two elements selected from this group.

Further, the electrode surface 108 includes a second region 320 which contains the metallic element 311 and has a higher content ratio of a nonmetallic element 321 than that in the first region 310.

In the example of FIG. 1, the nonmetallic element 321 is oxygen. In other words, the second region 320 in the electrode surface 108 is an oxidized region caused to have local anisotropy. However, the embodiments are not limited only to the foregoing and the nonmetallic element 321 may apply at least one element selected from the group consisting of nitrogen, oxygen, fluorine, and chlorine.

Here, the first region 310 may also contain the nonmetallic element 321. However, the second region 320 has a higher content ratio of the nonmetallic element 321 than that in the first region 310. Including the case where the first region 310 does not contain the nonmetallic element 321, it is to be noted that the second region 320 always has a higher content ratio of the nonmetallic element 321 than that in the first region 310.

Moreover, the content ratio of the nonmetallic element 321 in the second region 320 is set preferably not less than 1 atom %.

Further, the shape of at least any of the first region 310 and the second region 320 is anisotropic in the electrode surface 108.

For example, on the electrode surface 108 illustrated in FIG. 1, each of the first regions 310 and the second regions 320 is formed into a strip shape extending in the x-axis direction. This example shows the case where the first electrodes 110 also extend in the x-axis direction. However, as will be described later, it is also possible to set the direction of extension of the first regions 310 and the second regions 320 i.e., the anisotropy direction independently of the direction of extension of the first electrodes 110.

In this way, a difference in polarity is generated between the metallic element 311 and the nonmetallic element 321 in the second region 320 whereby a polarization pair is generated. Accordingly, it is possible to improve orientation of the film, which serves as the memory portion 140, to be formed by deposition on the electrode surface 108.

For example, the second region 320 can be formed by providing a resist mask of a predetermined shape on the film serving as the first electrode 110 by a lithography method, and then forming an oxide film in a predetermined shape on the electrode surface 108 by surface oxidation in a gas phase or a liquid phase. Meanwhile, it is also possible to form the second region 320 by performing ion implantation while scanning in a narrow line width on the film serving as the first electrode 110. Further, it is also possible to apply an oxidation process by anisotropically radiating a light beam, an electron beam or the like in an oxidation atmosphere onto the film serving as the first electrode 110, for example. That is, a layer including an anisotropic shape such as a narrow strip of an oxide or the like may be formed on the electrode surface 108.

In this way, a polarization pair layer is formed at least on the outermost surface of the first electrode 110.

Here, this polarization pair layer refers to the aforementioned anisotropic oxide layer, for example, and does not include layers without anisotropy such as a natural oxide layer.

Specifically, in the case of the non-volatile memory device 10 according to this embodiment, the oxide layer is artificially formed at a pitch of 100 nm and in a width of 10 nm on the electrode surface 108, for example. In this way, it is possible to obtain a layer which is oriented on the entire surface and in the entire layer thickness of the memory portions, just by depositing a $CeO_2$ layer or the like constituting the memory portions 140 in a thickness of several nanometers.

That is, in the non-volatile memory device 10 according to this embodiment, the principal element (the metallic element 311) constituting at least a region near the surface of the first electrode 110 and a substance (the nonmetallic element 321) such as nitrogen, oxygen, fluorine or chlorine whose electronegativity is considerably different from the principal element are introduced to the electrode surface 108 by ion implantation or oxidation (nitridation, fluoridation, and so forth).

Specifically, any elements that form polarization pairs can be used as long as a method of forming a nonmetallic compound such as oxidation, nitridation, fluoridation or chloridation is applicable.

Such an introduction process may be an ion implantation process which brings about a concentration gradient, a partial oxidation process (which means oxidation in a broad sense and may also include nitridation, fluoridation, and the like) using an atmosphere by a lithographic technique, or an oxidation process by feeding a current in an ambient pressure oxygen atmosphere with a probe used for AFM.

The above-described second region 320 (the region to be oxidized) is formed near the surface of the first electrode 110. Oxidation in the entire thickness direction of the first electrode 110 leads to detachment attributable to volume expansion and consequential deterioration in adhesion to a substrate located below the substrate to be oxidized. When only the region near the surface is oxidized, local expansion of the second region 320 can be sufficiently absorbed, so that a layer to serve as a base for orientation can be provided without accompanying a major impact.

The second region 320 serves as a resistance layer when the conductivity of the second region 320 is lower than that of the first region 310. In the non-volatile memory device 10, electric fields are concentrated on this resistance layer and the function as an element is therefore damaged. Since the non-volatile memory device 10 of this embodiment has the electrically conductive first region 310 exposed (remaining) on the electrode surface 108, it is possible to improve the orientation of the memory portion 140 by use of the second region 320 while maintaining the conductivity.

Note that the orientation stated herein does not only mean orientation close to a complete biaxial orientation, that is, orientation with $\Delta\phi$ of 4 or less degrees which is close to single crystal orientation, but also mean orientation with $\Delta\phi$ around 20 degrees, which is orientation that may serve as a base for the orientation.

To ensure the conductivity between the electrode 111 and the memory portion 140 and to achieve improvement in the orientation at the same time, a polarized region is provided not by continuously oxidizing a large area by natural oxidation or the like, but by providing an oxidized region of a small area in such a shape as a rectangular shape or a linear shape which has a large aspect ratio and extends in a certain direction so as to aid the orientation. Even if the entire polarized region (the second region 320) is an insulator, the total resistance value is only twice as high when the linear polarized regions are scattered over the entire surface of the film and an aggregate area reaches 50%. Accordingly, it is still possible to ensure the conductivity between the electrode 111 and the memory portion 140.

In the non-volatile memory device 10 of this embodiment, the electrodes 111 (the first electrodes 110) may be made of a single metal substance or an alloy.

Here, in terms of two different metallic elements, polarity between these metallic substances is smaller than polarity between a metal substance and a nonmetal substance. This is obvious from the difference in electronegativity between the metal and the nonmetal. For example, the difference in electronegativity between Cu and Y is only 0.3. On the other hand, the difference in electronegativity between Cu and O is 2.3, which is considerably greater than the difference in electronegativity between Cu and Y. That is, in the non-volatile memory device 10 of this embodiment, the polarity between the metallic elements 311 used in the electrode 111 is as small as negligible even in the case of mutually different metallic elements in comparison with any of nitrides, oxides, fluorides, chlorides and the like formed as the memory portion 140. Hence no polarization pair is virtually formed on the surface of the electrode 111.

Next, a description will be given on how the orientation of the memory portion 140 is improved by utilizing the polarized region.

The improvement in the orientation is substantially proportional to a boundary length between the polarized region and a non-polarized region. For example, if O is partially introduced onto metal Ni as the polarized region, then Ni is charged to a value $\Delta+$ while O is charged to a value $\Delta-$.

A range of impact that the polarization pair of $\Delta+$ and $\Delta-$ has on a layer stacked next thereon depends on a mean free path of incoming particles in the case of a physical vapor deposition method, and polarities and structures of the substrate and the particles. For example, if a Ni—O particle comes above a Ni—O polarization pair, the upper Ni atom and the lower O atom attract each other. Since the O atom is bonded next to the upper Ni atom, a plane in which an additional layer is stacked comes to have a polarized region increased at least by a region equivalent to the region of the originally existing polarization pairs.

This aspect represents the minimum spreading amount. In the course of film deposition according to a PLD (pulsed laser deposition) method, the particles wander about the mean free paths depending on energy that the particles possess on the surface of the substrate. Accordingly, a polarization pair region on the layer immediately thereabove is spread by 12 to 20 times as wide as lengths of the polarization pairs. Here, the length of the polarization pair is defined as a distance between two ends of a Δ+region and a Δ− region in one polarization pair.

A process for forming the polarization pair or the polarization pair region being an aggregate of the polarization pairs may apply a method of performing partial oxidation by a photolithography process or a method of beating elements other than those constituting the surface into the surface by ion implantation. Examples of these elements include nitrogen, oxygen, fluorine, and chlorine ions.

At this time, unlike the case where the polarized region is obtained by natural oxidation, it is important to mix the polarized regions as extensively as possible into the region which is not polarized. This is because the memory portion deposited on top of the polarized and unpolarized regions forms orientation starting from interfaces between the polarized and unpolarized regions. Due to a self-orientation property of the substance constituting the memory portion, the orientation spreads the polarized region in the form of propagation to surrounding areas along with an increase in the film thickness in the process of deposition of the memory portion.

A total length of a boundary region largely differs between the artificially-formed polarized region and the polarized region obtained by natural oxidation. In the case of natural oxidation, firstly, an oxidized region appears in a certain position. Then, the polarity in an adjacent region is disordered to facilitate subsequent oxidation, and the polarized region forms an aggregate to be located eccentrically in the plane. That is, the polarized region is formed so as to reduce the total length of the boundary region. When the substance constituting the memory portion is formed on this polarized region, it is possible to impart the orientation to the boundary region. However, since the boundary length of the polarized region is short, the rate of in-plane spreading of the polarized region is low. Moreover, the eccentrically located polarized region is apt to generate micro cracks and to cause a breakage where there is a difference in density or the like between the polarized region and the originally located material. Further, if the polarized region has low electric conductivity as described previously, the continuous polarized region is either an insulator or a substance close to an insulator. Hence the conductivity in that region is reduced.

Meanwhile, assume that the artificially formed polarized region is formed in a thin and long shape, i.e., a rectangular shape having a large aspect ratio, or in a similar shape on the surface. The density of the region varies significantly when the material changes from metal to an oxide. However, since the amounts of the substances are limited, the variation is easily absorbed as a strain whereby numerous regions for causing the orientation exist thereon without causing micro cracks or breakages. In addition, the conductivity is maintained since the metal portion is left over. By scattering these polarization pair regions over the entire surface, it is possible to achieve the improvement in the orientation at the time of film deposition to be described below.

The polarization pair is capable of causing the orientation when a substance having a polarity i.e., a substance such as a metal oxide having an ion bond is deposited thereon. The orientation is caused in a vertical direction in the substrate and the orientation improvement is also obtained in adjacent regions. In the case of a pulse laser deposition method, for example, when particles are landed on a surface of the deposited film around the oriented region, the particles will wander thereabout with kinetic energy. Accordingly, when there are the particles having the orientation, even if it is not perfect, within the range of mean free paths where the particles can travel freely, the particles can grow easily starting from that range. That is, new particles having the orientation are formed therefrom. Accordingly, on the oriented surface, the orientation is improved on the entire surface along with the growth of the particles. Such improvement is repeated when another surface is deposited thereon, and thus self-orientation is achieved.

Regarding the self-orientation, various calculations have been made for semiconductor-related elements including Si, GaAs, and so forth, and many of them have been released as patents and reports. However, there are only a limited number of reports concerning oxides which are related to superconductive materials for forming two-axis oriented films. There are very few calculation examples for the oxides. In an oxide, a unit cell having a polarity forms an orientation texture. In this regard, the self-orientation of the oxide is somewhat different from the self-orientation around the semiconductor. In this context, the lack of calculation formulae and calculation results is conceivably attributable to difficulties in boundary conditions.

In the case of the oxide, the self-orientation is determined not only by the energy of the particles and the unit cell but also by various other factors including: a difference in the electronegativity between the metal and the nonmetal; the distance between the metal and the nonmetal; a structure of the lattice; an amount of an impurity, and so forth. In addition, factors such as a difference in the lattice length that relates to the ease of orientation also deeply concern the control of orientation. Accordingly, it is easy to assume that calculations are extremely complicated. However, variations in the metal and the inorganic compound do not largely change the self-orientation. This is because there is a large difference in the electronegativity between the metal and the nonmetal and any combination of the metal and the nonmetal forms the unit cell having the large polarity. Here, nitrogen, oxygen, fluorine, and chlorine have advantages as the nonmetallic elements due to the large electronegativity.

FIG. 5 illustrates an aspect when forming the film serving as the memory portion 140 on the first electrode 110 in the non-volatile memory device.

As shown in FIG. 5, the orientation is improved along with an increase in the thickness of the film (such as an oxide) serving as the memory portion 140, and an oriented layer is obtained on the entire outermost surface when the film thickness and the oxide satisfy certain conditions. As for orientation of the oxide, almost any kind of the metal and the nonmetal may be caused to have orientation by selecting a condition for causing orientation in a metal oxide. This is because all of metal oxides are equally to known to have strong polarities, and thus the metal oxide has the lowest orientation. Regarding the orientation, it has been proven that almost the same goes with nitrides. Hence the embodiment can impart the orientation to any compound of the metal and the nonmetal.

Concerning the orientation, the value $\Delta\phi$ representing FWHM (full width at half maximum) of Phi scan is used. Here, a condition $\Delta\phi=90$ degrees represents an isotropic non-oriented state. As described previously, when depositing the material having the self-orientation, the value $\Delta\phi$ representing the orientation is improved (the numerical value is reduced) along with the increase in the film thickness. Concerning the value $\Delta\phi$ in this case, it is conceivable that a value $\Delta\phi/\Delta T$ (a differential value of the film thickness) at 90 degrees indicates the self-orientation which is unique to the substance. Since it is difficult to derive an inclination at 90 degrees from experimental data, the self-orientation relative to the film thickness can be calculated by use of data around Δϕ=45 degrees (in an ideal condition where just a half of grain boundary width is filled with oriented particles).

Among the metal oxides currently equipped with data representing the self-orientation, the oxide that exerts the highest value of $\Delta\phi/\Delta T$ is $CeO_2$, which has an effect to improve the orientation in a region of 20.0 nm in a horizontal direction of the substrate for 1 nm of the film thickness.

Assuming that the orientation improvement index is referred to as a degree of self-orientation a, the aforementioned index is expressed as a $(CeO_2)$=20.0.

Meanwhile, the indices a for $Gd_2Zr_2O_7$, $Y_2O_3$, $Y_2Zr_2O_7$, 8% $Gd_2O_3$-added $ZrO_2$, 12% $Y_2O_3$-added $ZrO_2$, and TiN are 16.2, 13.1, 16.6, 12.4, 12.0, and 15.6, respectively. While the oxides have large differences in polarities between the metallic element and the nonmetallic element therein, this difference does not largely differ among oxides, and does not largely differ among nitrides. Moreover, the above-mentioned indices show a fact that the orientation is improved in a region expanded at least by 12.0 nm in the horizontal direction each time any of the oxides is deposited in the thickness of 1 nm.

In the non-volatile memory device according to this embodiment, when the $CeO_2$ layer is formed at a width of 10 nm and in a length so as to reach both ends of the substrate on the metal at a pitch of 100 nm, for example, there is only a distance of (100−10)/2=45 nm away from a polarization-pair formation site which is an adjacent end. Accordingly, if $CeO_2$ is deposited in a thickness equal to or greater than 45 nm/8.00=5.6 nm, it is possible to obtain the texture which has the constant orientation over the entire surface.

FIGS. 6A and 6B illustrate states of the polarization pairs in the non-volatile memory device according to the first embodiment. Specifically, FIG. 6A shows the state where the first regions 310 and the second regions 320 are formed on the surface (the electrode surface 108) of the first electrode 110, thereby artificially forming polarized regions 322. Meanwhile, FIG. 6B exemplifies expanded polarized regions 323 when stacking the film serving as the memory portions 140 on the electrode surface 108.

As shown in FIGS. 6A and 6B, when the polarized regions 322 are expanded by performing the film deposition on the electrode surface 108, if the polarized regions 322 do not overlap one another, expansion thereof is equivalent to a value obtained by multiplying a total value of outer peripheral portions by the spreading amount of the polarized regions 322. Specifically, if the polarized regions 322 are an aggregate of thin lines as exemplified in the drawings, then the polarized regions 322 are largely expanded, and conductivity between the electrode surface 108 and the memory portion 140 is maintained. That is, this embodiment allows the compound of the metal and the nonmetal to be oriented on another metal while maintaining the conductivity.

Moreover, as shown in FIGS. 6A and 6B, in the case of the structure where the polarized regions 322 (the second regions 320) are arranged at a pitch of 300 nm, for example, it is possible to form half of the region between the polarized regions 322 into the polarized region when a resistance variable layer constituting the memory portions 140 is stacked in a thickness of 300 (nm)/2/12=12.5 nm. As described above, according to the non-volatile memory device of this embodiment, it is possible to form the original polarized region R and half of the remaining to-be-polarized region (100−R) into the polarized region when a layer having a thickness T is stacked thereon.

Specifically, in the non-volatile memory device 10 of this embodiment, the electrode surface 108 (an interface of the first electrode 10 on a side facing the memory portion 140) is made of the metallic element 311 containing the nonmetallic element 321. Here, assume that a polarization pair 330 denotes the region where the metallic element 311 is adjacent to a certain nonmetallic element 321, that a polarization length denotes a distance twice as long as a distance between the center of the metallic element 311 and the center of the nonmetallic element 321, and that a polarization pair region denotes the region containing other polarization pairs existing within the distance of the polarization length viewed from an end of the polarization pair 330.

Here, an outer periphery of the polarization pair region within a plane that is parallel to the first electrode 110 and is above at a distance of T (nm) from the interface between the memory portion 140 and the first electrode 110 (the electrode) toward the memory portion 140 can be shifted at a distance not less than 12T outside of the outer periphery of the polarization pair region on the surface of the first electrode 110 facing the memory portion 140.

Moreover, assuming that R (%) denotes an area ratio of the area of the polarization pair region on the surface of the first electrode 110 on the side facing the memory portion 140 relative to the surface of the first electrode 110 on the side facing the memory portion 140, the value R can be set not more than 50.

Further, a ratio of a total area of the polarization pair region and a region extending by a distance of 12T from the end of the polarization pair region, relative to the area of the surface of the first electrode 110 on the side facing the memory portion 140 can be increased to R+(100−R)/2 (%).

The polarization pair region inside the memory portion 140 can be defined as an orientation improved region which is relatively highly orientated.

Moreover, the non-volatile memory device 10 according to this embodiment includes the stacked structure provided with the first electrodes 110 (the electrodes 111) and the memory portions 140, and the voltage application portions (which are the second electrodes 120 in this example) configured to change a resistance in the memory portions 140 by applying the voltage to the memory portions 140 and thereby to store the information. Here, the interface of each of the first electrodes 110 on the side facing the memory portion 140 at least includes any one of the metallic elements, Si, Ga, and As (i.e., the metallic element 311), and the nonmetallic element 321. Moreover, the distance twice as long as the distance between the metallic element 311 and the nonmetallic element 321 in the polarization pair formed of the pair of the metallic element 311 and the nonmetallic element 321 which are adjacent to each other on the interface is defined as the polarization length. Meanwhile, the region containing other polarization pairs existing within the range of the polarization length viewed from the end of the polarization pair is defined as the polarization pair region. Further, the area ratio of the polarization pair region to the interface is defined as R (%). At this time, the memory portion 140 includes the orientation improved region being provided on the polarization pair region and which is relatively highly orientated. The outer periphery of the orientation improved region on the plane spaced by a distance of T (nm) from the interface toward the memory portion 140 is located on the outside by the distance equal to or more than 12T away from the outer periphery of the polarization pair region on the interface. Here, the area of the orientation improved region on the plane at the distance of T (nm) can be set not less than {R+(100−R)/2} (%) relative to the area of the interface.

As described above, according to the non-volatile memory device of this embodiment, it is possible to provide the non-volatile memory device having high durability and high performances and being provided with the highly oriented memory portions while maintaining the conductivity between the electrodes and the memory portions.

FIRST COMPARATIVE EXAMPLE

Figure 7:
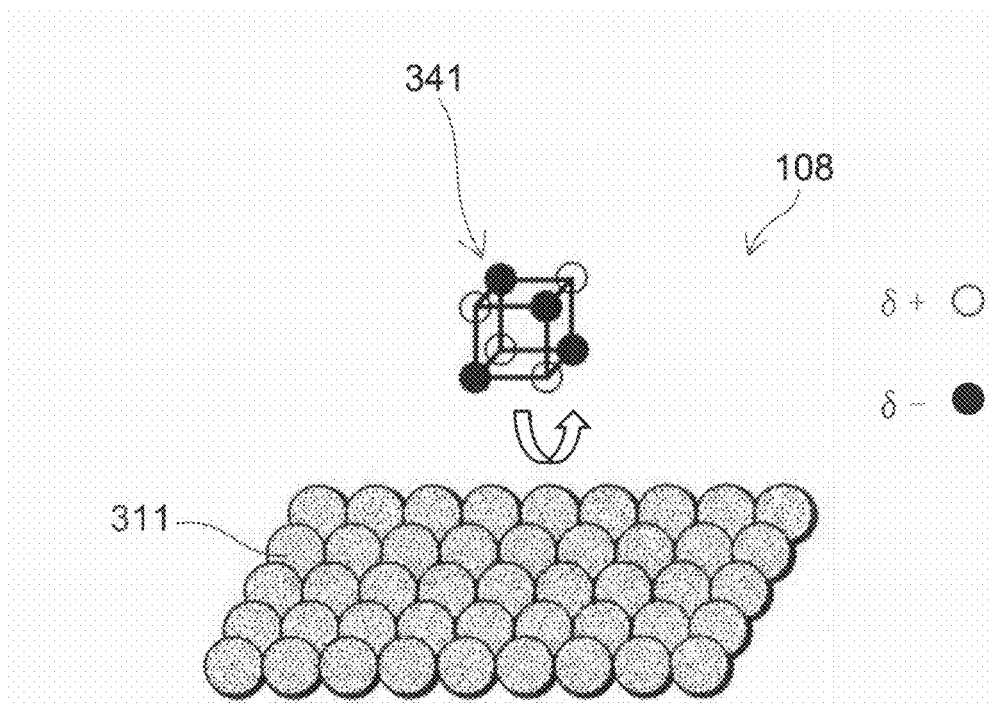
FIG. 7 is a conceptual diagram illustrating the configuration of substantial part in a non-volatile memory device of a first comparative example.

FIG. 7 is a conceptual diagram illustrating a configuration of substantial part in a non-volatile memory device of a first comparative example.

Specifically, this drawing exemplifies a condition of the electrode surface 108 in the case of the first comparative example.

As shown in FIG. 7, the electrode surface 108 of the first electrode 110 of the first comparative example is a metallic surface not provided with the oxide layer (the second region 320 in this embodiment), which consists of the metallic element 311. Since the metal represents metallic bonding of isotropic charges, no polarization pair is formed on the electrode surface 108. Accordingly, if an oxide 341 having the polarity and serving as the memory portion 140 is deposited thereon, the oxide 341 is not oriented. As a result, it is not possible to obtain the memory portion having fine orientation.

SECOND COMPARATIVE EXAMPLE

Figure 8:
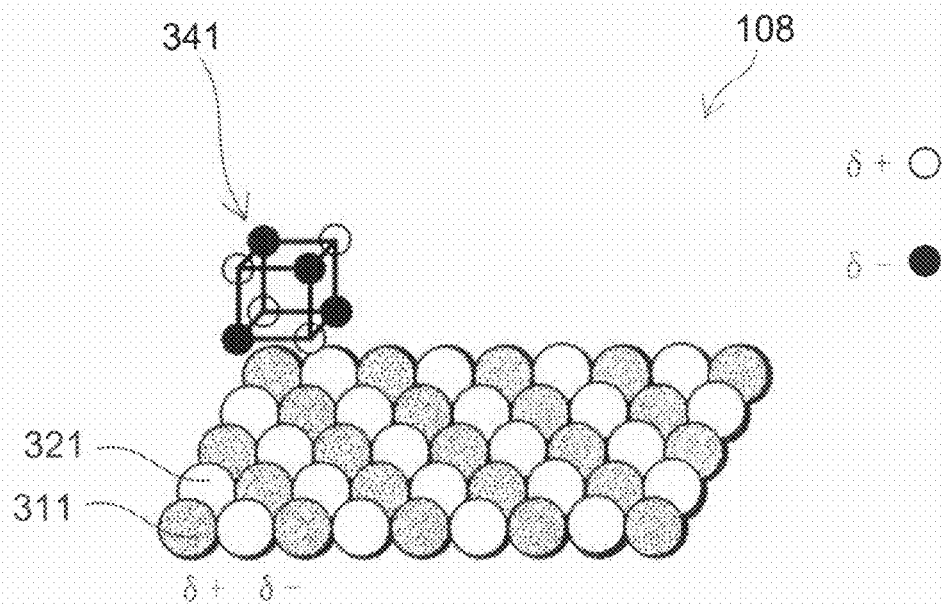
FIG. 8 is a conceptual diagram illustrating the configuration of substantial part in a non-volatile memory device of a second comparative example.

FIG. 8 is a conceptual diagram illustrating the configuration of substantial part in a non-volatile memory device of a second comparative example.

As shown in FIG. 8, in the second comparative example, the electrode is made of an oxide single crystal and the metallic element 311 and the nonmetallic element 321 exist on the electrode surface 108. Nevertheless, unlike the non-volatile memory device according to this embodiment, the content ratio of the nonmetallic element 321 is constant across the electrode surface 108. Specifically, this non-volatile memory device is not provided with the region (the second region 320) having the different content ratio of the nonmetallic element 321.

In this case, though the electrode surface 108 has the polarization pairs, it is known that the vertical combinations are limited due to a problem in light of lattice matching with the substance located above (the oxide 341) when the conductive oxide is used as a base electrode of the oxide 341 serving as the memory portion 140. Here, concerning the lattice matching, it is said that the fine orientation is generated up to 7% of the lattice length. However, the orientation is improved even if there is a higher degree of lattice mismatch.

Moreover, most of metal oxides have poor conductivity and therefore have many problems when used as an orientation layer for the non-volatile memory device of the resistance change type because the metal oxides induce an increase in a forming voltage or destruction of other components due to a high voltage.

THIRD COMPARATIVE EXAMPLE

Figures 9A, 9B:
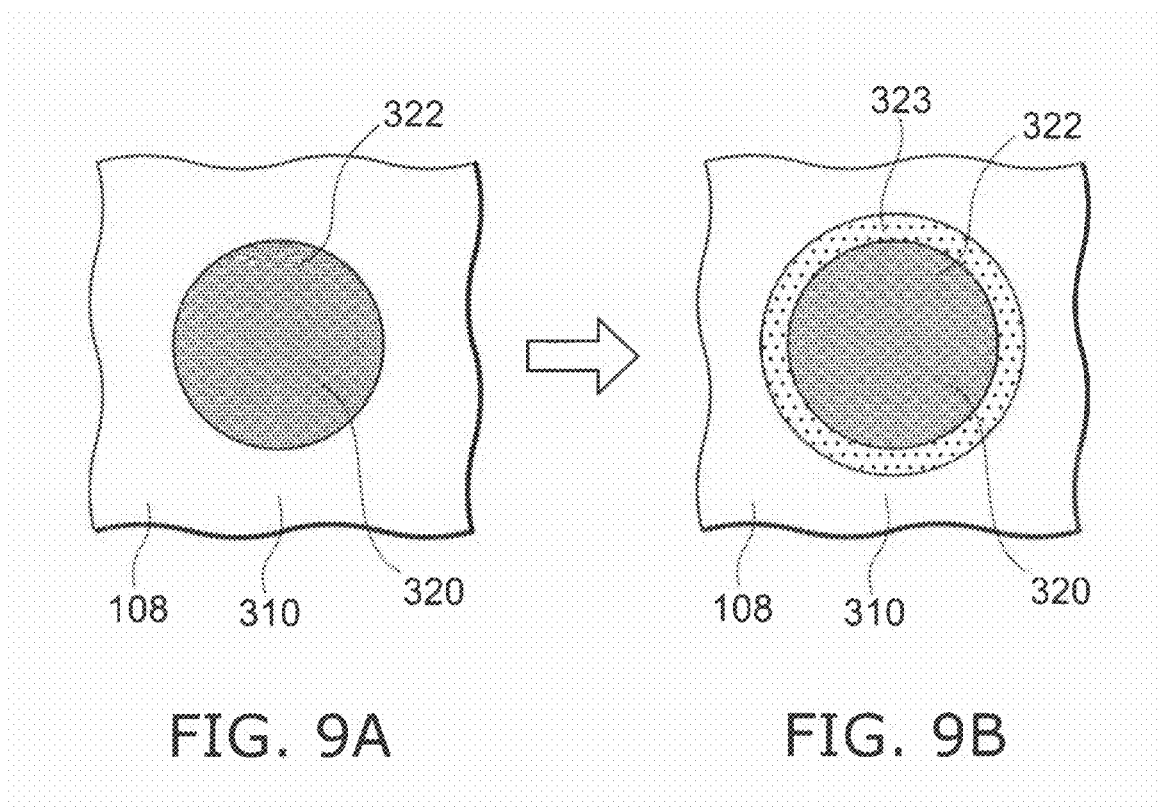
FIGS. 9A and 9B are schematic plan views illustrating states of a polarization pair in a non-volatile memory device of a third comparative example.

FIGS. 9A and 9B are schematic plan views illustrating states of a polarization pair in a non-volatile memory device of a third comparative example.

Specifically, FIG. 9A illustrates a state of a polarized region obtained by natural oxidation while FIG. 9B illustrates a state of the expanded polarized region when depositing a layer serving as the memory portion 140 on the polarized region of FIG. 9A.

As shown in FIGS. 9A and 9B, if the polarization regions 322 do not overlap one another, the expansion thereof substantially represents expansion of the area equivalent to a value obtained by multiplying the total value of the outer peripheral portion of the polarized region 322 by the spreading amount. Accordingly, the region where the orientation is improved does not expand rapidly.

Moreover, the expansion of the polarized region 322 from this state of natural oxidation merely becomes equal to a value obtained by multiplying a total length of the outer peripheral portion by an increased film thickness ΔT and 12 even when the film is stacked in the thickness direction. In the case of natural oxidation where the polarized region 322 is continuous, assume that the percentage of the polarized region 322 in the total area is defined as R. To form half of the remaining region (100−R) into the polarized region 322, the value must be obtained by multiplying half of the distance between the edge of the polarized region and the edge of the deposited film by 12 that represents an expansion speed relative to the film thickness of the polarized region 322. That is, if there is a distance of 1 mm to the edge, then it is necessary to deposit the film in the thickness of 1 (mm)/2/12=41.4 μm. Such a film thickness is hardly achievable by a normal process.

Specifically, a natural oxide layer does not possess anisotropy in a plane thereof and the oxide layer tends to spread adjacently to the oxidized region on the metal surface. In that case, an oxidized region will spread locally in a part of the metal surface.

In this case, only the edge of the oxide region, i.e., the region where there are the polarization pairs, is oriented when the film serving as the memory portion 140 is deposited thereon. Accordingly, it is not possible to obtain the orientation layer if the film serving as the memory portion 140 is deposited on the electrode in which the oxide layer is formed on the surface by natural oxidation.

On the other hand, as described in conjunction with FIGS. 6A and 6B, in the case of the structure where the polarized regions 322 (the second regions 320) are arranged at the pitch of 300 nm such as the non-volatile memory device 10 according to this embodiment, for example, it is possible to form half of the region between the polarized regions 322 into the polarized region by stacking the resistance variable layer constituting the memory portions in the thickness of 300 (nm)/2/12=12.5 nm. In this way, according to the non-volatile memory device 10 of this embodiment, it is possible to form the original polarized region R and half of the remaining to-be-polarized region (100−R) into the polarized region when a layer having a thickness T is stacked thereon.

As described above, according to the non-volatile memory device of this embodiment, it is possible to offer the non-volatile memory device having high durability and high performances and being provided with the highly oriented memory portions while maintaining the conductivity between the electrodes and the memory portions.

FIG. 10A to FIG. 11B are schematic plan views illustrating various modified examples of the electrode surface in the non-volatile memory device according to the first embodiment.

Figure 10A:
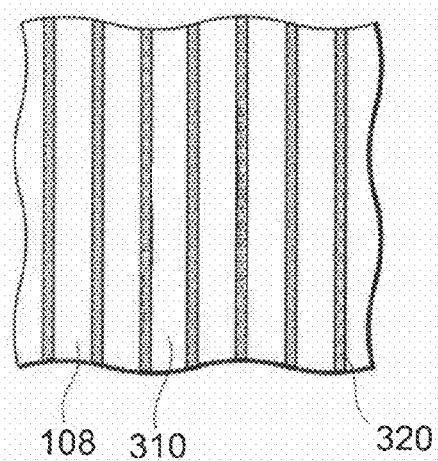
FIG. 10A to FIG. 13B are schematic plan views illustrating various variations of the electrode surface in the non-volatile memory device according to the first embodiment.

As illustrated in FIG. 10A, there are the first regions 310 and the second regions 320 on the electrode surface 108, and the second regions 320 are formed into strip shapes extending in one direction. Specifically, the second regions 320 have anisotropic shapes. Moreover, the conductive first regions 310 are exposed on the electrode surface 108. In this way, when the film serving as the memory portions 140 is formed on this electrode surface 108, it is possible to enhance the orientation of the film while maintaining conductivity.

Figure 10B:
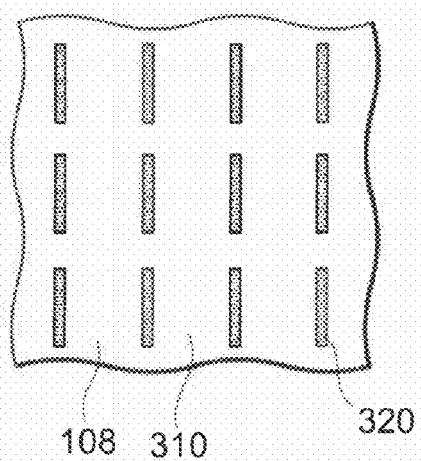

As illustrated in FIG. 10B, there are the first regions 310 and the second regions 320 on the electrode surface 108, and the second regions 320 are formed into thin rectangular shapes and long sides of the rectangles are arranged in one direction. Accordingly, the second regions 320 have anisotropic shapes and the shapes are anisotropically arranged. Moreover, the conductive first regions 310 are exposed on the electrode surface 108. In this way, although being formed independently, the second regions 320 have anisotropy and the regions are arranged anisotropically. Accordingly, when the film serving as the memory portions 140 is formed on this electrode surface 108, it is possible to enhance the orientation of the film while maintaining conductivity.

Figure 10C:
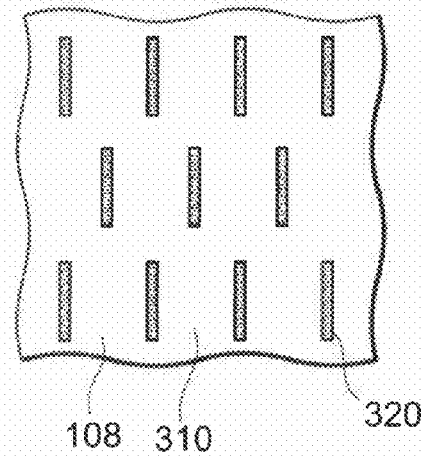
Figure 10D:
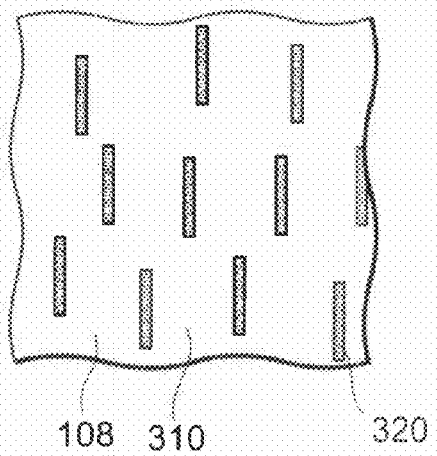

As illustrated in FIGS. 10C and 10D, there are the first regions 310 and the second regions 320 on the electrode surface 108, and the second regions 320 are formed into thin rectangular shapes and long sides of the rectangles are arranged in one direction. In the case of FIG. 10C, positions of the center of gravity of the second regions 320 are arranged regularly while shifting phases at the pitch of arrangement. Meanwhile, in the case of FIG. 10D, positions of the center of gravity of the second regions 320 are at random. In both of these cases, the second regions 320 have anisotropic shapes and the shapes are anisotropically arranged. In these cases as well, the conductive first regions 310 are exposed on the electrode surface 108. In this way, the second regions 320 have anisotropic shapes and are arranged anisotropically. Accordingly, when the film serving as the memory portions 140 is formed on this electrode surface 108, it is possible to enhance the orientation of the film while maintaining conductivity.

Figure 10E:
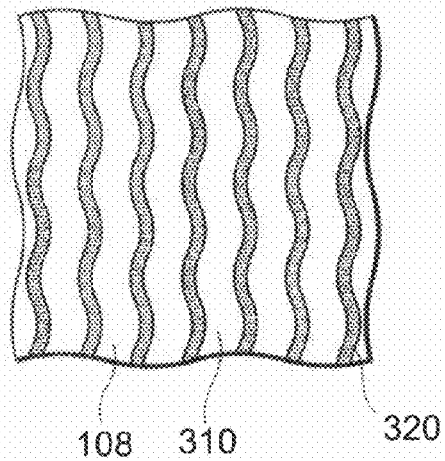

Meanwhile, as illustrated in FIG. 10E, there are the first regions 310 and the second regions 320 on the electrode surface 108, and the second regions 320 are formed into continuous wavy shapes extending in one direction. In this way, the second regions 320 have anisotropic shapes. Moreover, the conductive first regions 310 are exposed on the electrode surface 108. Thus, the second regions 320 may have shapes including various curved boundaries such as the wavy shapes instead of the linear shapes, as long as the shapes and the arrangement have anisotropy. In this way, when the film serving as the memory portions 140 is formed on this electrode surface 108, it is possible to enhance the orientation of the film while maintaining conductivity.

Figure 10F:
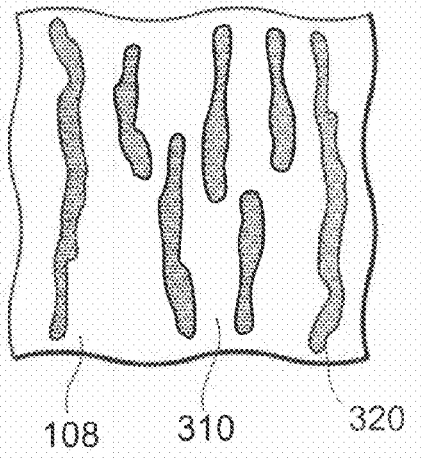

Meanwhile, as illustrated in FIG. 10F, there are the first regions 310 and the second regions 320 on the electrode surface 108, and the second regions 320 are formed into random but elongated and independent island shapes of which longitudinal directions are arranged in one direction. Moreover, the conductive first regions 310 are exposed on the electrode surface 108. As described above, the second regions 320 may have shapes including various curved boundaries and may be in the form of independent islands, as long as the shapes and the arrangement have anisotropy. In this way, when the film serving as the memory portions 140 is formed on this electrode surface 108, it is possible to enhance the orientation of the film while maintaining conductivity.

Figure 11A:
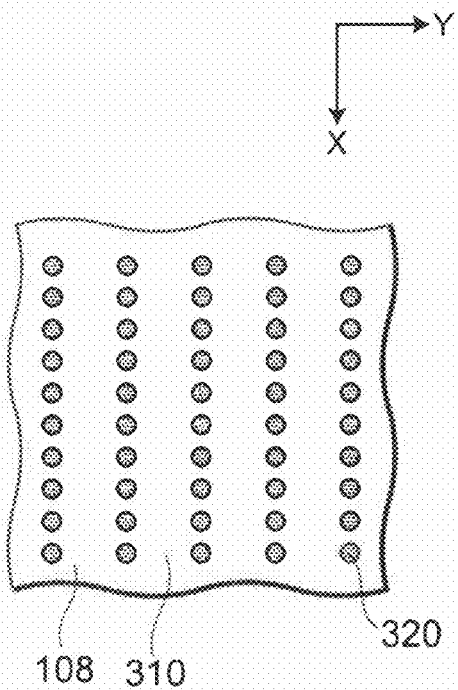

Meanwhile, as illustrated in FIG. 11A, there are the first regions 310 and the second regions 320 on the electrode surface 108, and the second regions 320 are formed into substantially circular shapes, i.e., the shapes without anisotropy, but a direction of arrangement thereof has anisotropy. Specifically, the second regions 320 are disposed to be aligned in substantially straight lines.

That is, the layout of the second regions 320 has anisotropy in the plane of the electrode surface 108. Specifically, an average of arrangement intervals of the second regions 320 in a first direction (which is an x-axis direction in the drawing, for example) is different from an average of arrangement intervals of the second regions 320 in a second direction (which is a y-axis direction in the drawing, for example) that is different from the first direction. In the case of this drawing, the average of arrangement intervals in the x-axis direction is smaller than the average of arrangement intervals in the y-axis direction.

Moreover, the conductive first regions 310 are exposed on the electrode surface 108. As described above, even though each second region 320 has the planar shape lacking anisotropy, the arrangement of the regions still has anisotropy. In this way, when the film serving as the memory portions 140 is formed on this electrode surface 108, it is possible to enhance the orientation of the film while maintaining conductivity.

Figure 11B:
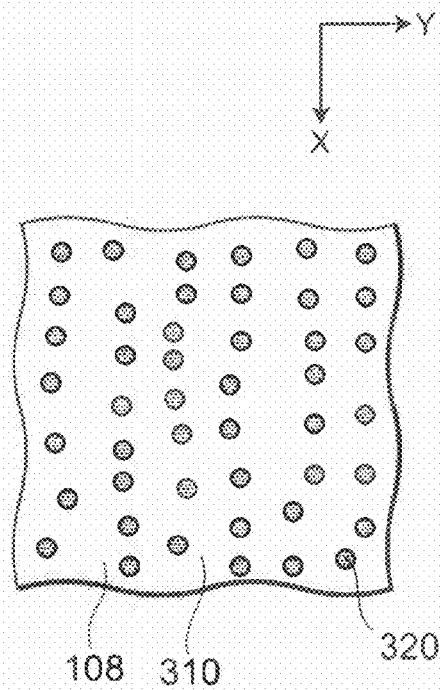

Meanwhile, as illustrated in FIG. 11B, there are the first regions 310 and the second regions 320 on the electrode surface 108, and the second regions 320 are formed into substantially circular shapes without anisotropy, but a direction of arrangement thereof has anisotropy. Specifically, the second regions 320 are not disposed to be aligned straight but are disposed in a certain direction (the x-axis direction) on average as a whole.

In this case as well, an average of arrangement intervals of the second regions 320 in a first direction (which is an x-axis direction in the drawing, for example) is different from an average of arrangement intervals of the second regions 320 in a second direction (which is a y-axis direction in the drawing, for example) that is different from the first direction. In the case of this drawing, the average of arrangement intervals in the x-axis direction is smaller than the average of arrangement intervals in the y-axis direction.

Moreover, the conductive first regions 310 are exposed on the electrode surface 108. As described above, even though each second region 320 has the planar shape lacking anisotropy, the arrangement of the regions still has anisotropy. In this way, when the film serving as the memory portions 140 is formed on this electrode surface 108, it is possible to enhance the orientation of the film and while maintaining conductivity.

As described above, in the non-volatile memory device 10 according to this embodiment, the second regions 320 (or at least any of the second regions 320 and the first regions 310) have at least any of the anisotropic shape and the anisotropic arrangement on the electrode surface 108. In this way, the orientation is enhanced when depositing the film serving as the memory portions 140 while conductivity is maintained. Hence it is possible to provide the non-volatile memory device having high durability and high performances and being provided with the highly oriented memory portions while maintaining the conductivity between the electrodes and the memory portions.

FIG. 12A to FIG. 13B are schematic plan views illustrating various modified examples of the electrode surface in the non-volatile memory device according to the first embodiment.

Figure 12A:
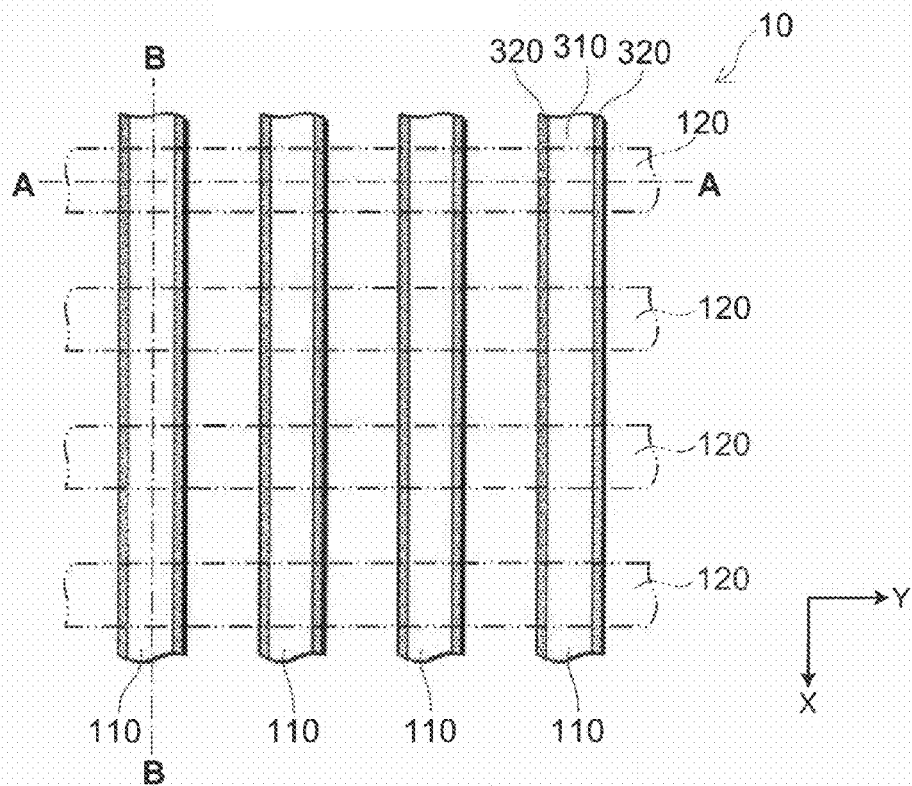

FIG. 12A illustrates a planar layout of the first regions 310 and the second regions 320 of the non-volatile memory device 10 according to this embodiment exemplified in conjunction with FIG. 1 to FIG. 3C.

As shown in FIG. 12A, in the non-volatile memory device 10, the second regions 320 are provided on both side portions of each of the first electrodes 110 along the direction of extension of the first electrodes 110. In the non-volatile memory device 10, the first electrodes (and the second electrodes 120) are often formed at the smallest width and at the smallest interval processable. In this case, as will be described later, the second regions 320 as exemplified in FIG. 12A can be formed along the side portions of the first electrodes 110 by forming a resist mask on the conductive film serving as the first electrodes 110 at a smaller width than the width supposed to be applied to the first electrodes 110 by slimming of the resist mask in a photolithography process and then performing oxidation processing. In this way, it is possible to ensure conductivity between the first electrodes 110 and the memory portions 140 while reducing virtual adverse effects on the electric resistance and to thereby enhance the orientation of the film serving as the memory portions 140 to be formed thereon.

Figure 12B:
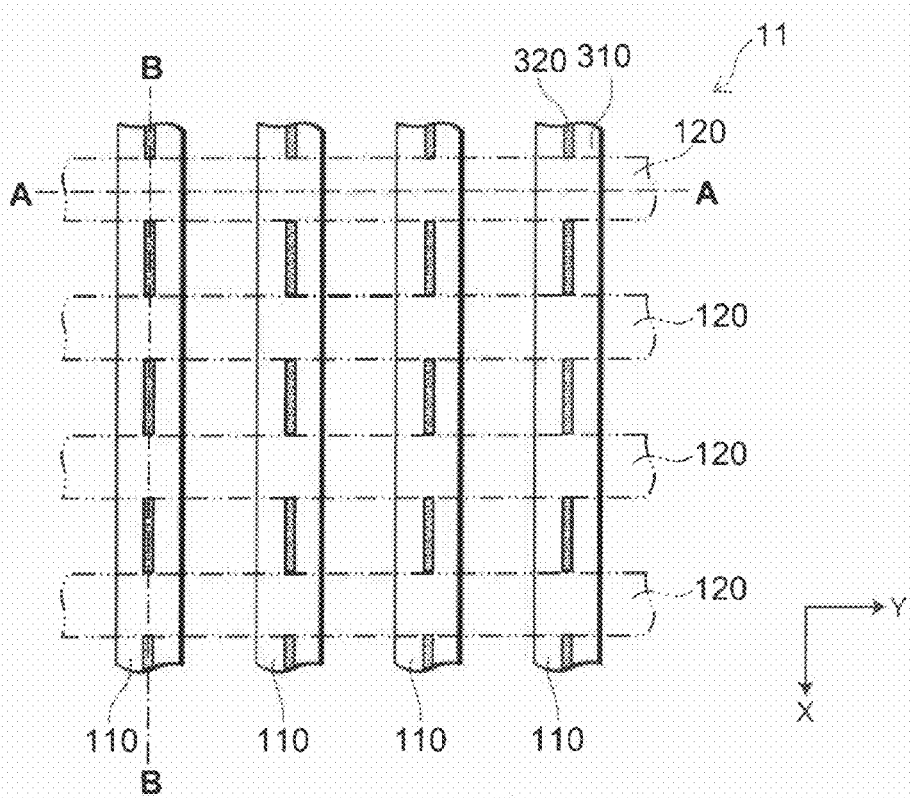

FIG. 12B illustrates a planar layout of the first regions 310 and the second regions 320 of a non-volatile memory device 11 of a different type according to this embodiment.

As shown in FIG. 12B, in the non-volatile memory device 11, the second regions 320 are provided on the first electrodes 110 in respective spaces provided between intersections where the first electrodes 110 intersect with the second electrodes 120. Namely, the second regions 320 are disposed in external regions of the intersections where the voltage application portion 121 (the second electrodes 120) intersects the electrodes 111 (the first electrodes 110). Moreover, the second regions 320 are formed into rectangular shapes and are disposed substantially in central positions of the first electrodes 110 along the direction of extension of the first electrodes 110 while aligning longitudinal sides thereof with the direction of extension of the first electrodes 110. As described above, by providing the second regions 320 outside memory cell portions where the first electrodes 110 intersect with the second electrodes 120, it is possible to eliminate adverse effects to electric resistance at the interfaces between the first electrodes 110 and the memory portions 140, to ensure conductivity between the first electrodes 110 and the memory portions 140, and to enhance the orientation of the film serving as the memory portions 140 to be formed thereon.

Here, it is possible to provide the second regions 320 along both side surfaces of the first electrodes 110 as exemplified in FIG. 12A and to provide the second regions 320 on the first electrodes 110 in respective spaces provided between the intersections of the first electrodes 110 and the second electrodes 120 as shown in FIG. 12B. In this case as well, it is possible to eliminate adverse effects to electric resistance at the interfaces between the first electrodes 110 and the memory portions 140, to ensure conductivity between the first electrodes 110 and the memory portions 140, and to enhance the orientation of the film serving as the memory portions 140 to be formed thereon.

Figure 13A:
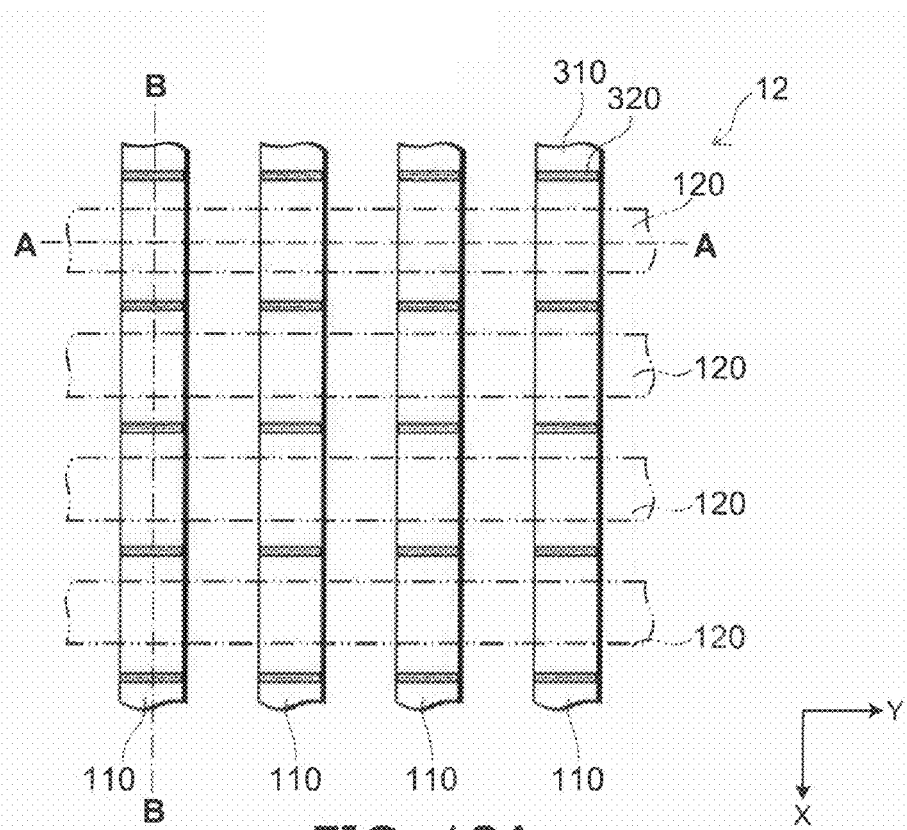

FIG. 13A illustrates a planar layout of the first regions 310 and the second regions 320 of still another non-volatile memory device 12 according to this embodiment.

As shown in FIG. 13A, in the non-volatile memory device 12, the second regions 320 are provided on the first electrodes 110 in respective spaces provided between intersections where the first electrodes 110 intersect with the second electrodes 120. Moreover, the second regions 320 are formed into rectangular shapes and are disposed substantially in central positions of the first electrodes 110 while aligning longitudinal sides thereof with the direction of extension of the second electrodes 120 (with a direction orthogonal to the direction of extension of the first electrodes 110). As described above, by providing the second regions 320 outside the memory cell portions where the first electrodes 110 intersect with the second electrodes 120, it is possible to eliminate adverse effects to electric resistance at the interfaces between the first electrodes 110 and the memory portions 140, to ensure conductivity between the first electrodes 110 and the memory portions 140, and to enhance the orientation of the film serving as the memory portions 140 to be formed thereon. In this way, the layout of the second regions 320 may be set either parallel to the direction of extension of the first electrodes 110 or orthogonal thereto FIG. 13B illustrates a planar layout of the first regions 310 and the second regions 320 of still another non-volatile memory device 13 according to this embodiment.

Figure 13B:
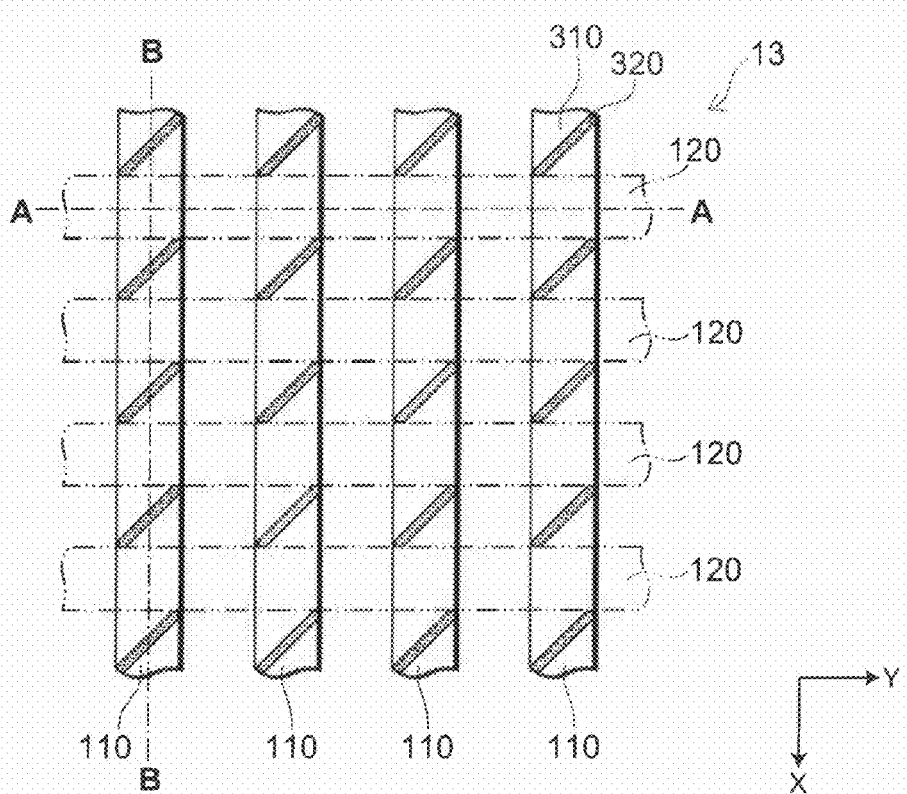

As shown in FIG. 13B, in the non-volatile memory device 13, the second regions 320 are provided on the first electrodes 110 in respective spaces provided between intersections where the first electrodes 110 intersect with the second electrodes 120. Moreover, the second regions 320 are formed into rectangular shapes and are disposed substantially along a direction such that longitudinal sides thereof define 45 degrees with the direction of extension of the first electrodes 110. As described above, by providing the second regions 320 outside the memory cell portions where the first electrodes 110 intersect with the second electrodes 120, it is possible to eliminate adverse effects to electric resistance at the interfaces between the first electrodes 110 and the memory portions 140, to ensure conductivity between the first electrodes 110 and the memory portions 140, and to enhance the orientation of the film serving as the memory portions 140 to be formed thereon.

Concerning the above-described configuration, it is also possible to dispose the second regions 320 such that the longitudinal sides thereof define 135 degrees with the direction of extension of the first electrodes 110. In addition, it is also possible to set the layout angle of the second regions 320 relative to the direction of extension of the first electrodes 110 to an arbitrary value.

Now, examples of this embodiment will be described below.

FIRST EXAMPLE

A resist mask having a predetermined pattern is formed on a polished surface of a 10-mm square Ti metal substrate by a photolithography method.

The pattern is designed as a multiple strip-shaped pattern having a width of apertures equal to 40 nm and a pitch in the width direction equal to 200 nm. In this pattern, the strips extend across both ends of the metal substrate.

This substrate is subjected to oxidation in a pure oxygen atmosphere at $10 \times 10^5$ Pa. At this time, oxidation periods are changed to 1 second, 10 seconds, and 100 seconds. The substrates subjected to the oxidation for the periods of 1 second, 10 seconds, and 100 seconds are defined as a sample A1, a sample A2, and a sample A3, respectively.

Thereafter, the resist mask is dissolved and removed, and the substrate is cleaned so that no resist mask is left. Then, an ultrasonic cleaning process for two minutes is executed twice in acetone and then a similar ultrasonic cleaning process for two minutes is executed twice in absolute ethanol. Then the substrates are let stand for three hours in a glass drying system at 60° C. until they are completely dry.

Thereafter, the film serving as the memory portions is deposited on the samples A1 to A3 with the PLD method while setting a substrate temperature to 500° C., using an oxygen atmosphere at $10 \times 10^{-2}$ Pa, and setting a laser beam output to 130 mJ/mm$^2$. Here, $ZnMn_2O_4$ is used as a target and the film is deposited in a thickness of 20 nm on all the samples A1 to A3.

Degrees of in-plane orientation of the films deposited on the samples A1 to A3 are measured in accordance with pole figure measurement to find values $\Delta\phi$ representing the full width at half maximum. Results of the values $\Delta\phi$ of the films on the samples A1 to A3 turn out to be 18.5 degrees, 17.3 degrees, and 16.9 degrees, respectively. Accordingly, all the films formed under the above-described conditions are oriented.

Concerning the samples A1 to A3 of this example, it is conceivable that degrees of oxidation may vary at portions exposed to the gas at the time of oxidation because of the variation in the oxidation period. However, even the oxidation for a short period has an effect to enhance the orientation. This is because the polarization pairs are formed even if oxidation takes place partially, and the degrees of in-plane orientation are improved since the oriented layer spreads from that portion when the film thickness increases at the time of deposition.

SECOND EXAMPLE

As similar to the first example, a resist mask having a predetermined pattern is formed on a surface of a Ti metal substrate.

The pattern is designed as a mesh pattern having a width and a length of apertures equal to 40 nm 2000 nm, respectively, and arranging elongated slits at a pitch in a width direction of 200 nm and a pitch in a length direction at 2200 nm along one direction.

This substrate is subjected to oxidation as similar to the first example. Samples obtained by performing the oxidation for the periods of 1 second, 10 seconds, and 100 seconds are defined as a sample B1, a sample B2, and a sample B3, respectively.

Thereafter, removal and cleaning of the resist mask and drying processes are executed as similar to the first example, and $ZnMn_2O_4$ films serving as the memory portions are deposited in a thickness of 20 nm.

Then, the values $\Delta\phi$ of the $ZnMn_2O_4$ films on the samples B1 to B3 are found as similar to the first example. Results turn out to be 18.7 degrees, 17.4 degrees, and 17.1 degrees, respectively. Accordingly, highly oriented memory portions are also formed under the conditions of this example.

As described above, the values $\Delta\phi$ of the samples of this example hardly differ from the results of the first example. This is because the degrees of orientation hardly differ as the orientation formed by the polarization pairs is isotropically propagated in longitudinal and lateral directions.

THIRD EXAMPLE

As similar to the first example, a resist mask having a predetermined pattern is formed on a surface of a Ti metal substrate. The pattern is designed as a mesh pattern having a width and a length of apertures equal to 40 nm and 400 nm, respectively, and arranging elongated slits at a pitch in a width direction of 200 nm and a pitch in a length direction at 440 nm along one direction.

This substrate is subjected to oxidation as similar to the first example. Samples obtained by performing the oxidation for the periods of 1 second, 10 seconds, and 100 seconds are defined as a sample C1, a sample C2, and a sample C3, respectively.

Then, after removal and cleaning of the resist mask and drying processes as similar to the first example, $ZnMn_2O_4$ films serving as the memory portions are deposited in a thickness of 20 nm.

Then, the values $\Delta\phi$ of the $ZnMn_2O_4$ films on the samples C1 to C3 are found as similar to the first example. Results turn out to be 18.5 degrees, 17.2 degrees, and 16.6 degrees, respectively. Accordingly, highly oriented memory portions are also formed under the conditions of this example.

As described above, the values $\Delta\phi$ of the samples of this example hardly differ from the results of the first and second examples. In this way, similarly oriented memory portions are formed on the substrates no matter how finely the polarization pairs to be formed on the substrates are split.

FOURTH EXAMPLE

As similar to the first example, a resist mask having the same pattern as the first example is formed on a surface of a Ti metal substrate.

This substrate is subjected to oxidation as similar to the first example. However, the oxidation period is set to 100 seconds.

Then, after removal and cleaning of the resist mask and drying processes as similar to the first example, $ZnMn_2O_4$ films serving as the memory portions are deposited. Here, the thicknesses of the $ZnMn_2O_4$ films are changed to 20 nm, 40 nm, 60 nm, 80 nm, and 100 nm, and samples respectively corresponding thereto are defined as a sample D1, a sample D2, a sample D3, a sample D4, and a sample D5.

Then, the values $\Delta\phi$ of the $ZnMn_2O_4$ films on the samples D1 to D5 are found as similar to the first example. Results turn out to be 16.7 degrees, 13.4 degrees, 11.8 degrees, 10.3 degrees, and 9.1 degrees, respectively. Accordingly, the orientation of the $ZnMn_2O_4$ film tends to be enhanced along with the increase in the film thickness thereof.

Specifically, it is considered that the degree of orientation is improved with the increase in the film thickness due to the self-orientation property of the $ZnMn_2O_4$ film. This fact constitutes basic data for a fact that the orientation is improved by forming the polarization pairs on the metal and forming the memory portions in an adequate film thickness thereon.

FIFTH EXAMPLE

As similar to the first example, a resist mask having the same pattern as the first example is formed on a surface of a metal substrate. However, in this example, Ta having a polished surface is used as the metal substrate instead of Ti used in the first example.

This substrate is subjected to oxidation as similar to the first example. Samples obtained by performing the oxidation for the periods of 1 second, 10 seconds, and 100 seconds are defined as a sample E1, a sample E2, and a sample E3, respectively.

Then, after removal and cleaning of the resist mask and drying processes as similar to the first example, $ZnMn_2O_4$ films serving as the memory portions are deposited in a thickness of 20 nm.

Then, the values $\Delta\phi$ of the $ZnMn_2O_4$ films on the samples E1 to E3 are found as similar to the first example. Results turn out to be 18.1 degrees, 17.0 degrees, and 16.7 degrees, respectively. Accordingly, highly oriented memory portions are also formed under the conditions of this example.

As described above, the highly oriented memory portions are also obtained as similar to the first example even if the metal serving as the base material is changed to Ta.

SIXTH EXAMPLE

As similar to the first example, a resist mask having the same pattern as the first example is formed on a surface of a metal substrate. However, in this example, an alloy metal substrate being composed of Ti:Ta=50:50 and having a polished surface is used as the metal substrate instead of Ti used in the first example.

This substrate is subjected to oxidation as similar to the first example. Samples obtained by performing the oxidation for the periods of 1 second, 10 seconds, and 100 seconds are defined as a sample F1, a sample F2, and a sample F3, respectively.

Then, after removal and cleaning of the resist mask and drying processes as similar to the first example, $ZnMn_2O_4$ films serving as the memory portions are deposited in a thickness of 20 nm.

Then, the values $\Delta\phi$ of the $ZnMn_2O_4$ films on the samples F1 to F3 are found as similar to the first example. Results turn out to be 18.3 degrees, 17.2 degrees, and 16.8 degrees, respectively. Accordingly, highly oriented memory portions are also formed under the conditions of this example.

As described above, the highly oriented memory portions are also obtained as similar to the first example even if the metal serving as the base material is changed to an alloy.

SEVENTH EXAMPLE

As similar to the first example, a resist mask having the same pattern as the first example is formed on a surface of a Ti metal substrate.

This substrate is subjected to oxidation as similar to the first example while changing the oxidation periods to 1 second, 10 seconds, and 100 seconds. Then, after removal and cleaning of the resist mask and drying processes as similar to the first example, films serving as the memory portions are deposited. Here, any of the $Pr_{0.7}Ca_{0.3}MnO_3$ and NiO is used as the target. Samples obtained by using $Pr_{0.7}Ca_{0.3}MnO_3$ as the target and performing the oxidation for the periods of 1 second, 10 seconds, and 100 seconds are defined as a sample G1a, a sample G1a, and a sample G3a, respectively. Meanwhile, samples obtained by using NiO as the target and performing the oxidation for the periods of 1 second, 10 seconds, and 100 seconds are defined as a sample G1b, a sample G2b, and a sample G3b, respectively.

Then, the values $\Delta\phi$ of the films serving as the memory portions on the samples G1a to G3a are found as similar to the first example. Results turn out to be 16.4 degrees, 13.1 degrees, and 11.7 degrees, respectively. Meanwhile, the values $\Delta\phi$ of the films serving as the memory portions on the samples G1b to G3b are found. Results turn out to be 17.5 degrees, 14.1 degrees, and 12.6 degrees, respectively. As described above, it is possible to estimate existence of the self-orientation property unique to each substance from this example. Meanwhile, it is possible to impart the orientation similarly even when the substance is different, provided that the substance is a compound of metal and nonmetal.

EIGHTH EXAMPLE

As similar to the first example, a resist mask having the same pattern as the first example is formed on a surface of a Ti metal substrate.

This substrate is subjected to oxidation as similar to the first example for the period of 100 seconds. The substrate thus obtained is defined as a substrate H1.

In the meantime, as a comparative example, a 10-mm square Ti metal substrate having a polished surface but without undergoing the above-described process is defined as a substrate H2.

Films serving as the memory portions are deposited on these substrates H1 and H2 in accordance with the pulse laser deposition method (PLD method). Targets used in this process are targets containing different composition ratios of Zn and Mn. Each of the targets is fabricated by blending raw material powder so as to render a total composition of Zn:Mn equal to 3, and subjecting the raw material powder to a typical sintering process while maintaining a sufficient retention time period at an optimum sintering temperature for each composition.

An amount of Zn in each of the targets is in a range from 0 to 3. For example, a target containing the amount of Zn equal to 0.3 will be hereinafter referred to as Tz(0.30). Moreover, eight types of the targets, namely, Tz(0.00), Tz(0.10), Tz(0.30), Tz(0.50), Tz(0.70), Tz(1.00), Tz(2.00), and Tz(3.00) are used as the targets.

On the substrate H1 and the substrate H2 after depositing TiN/W/Si layers, the films serving as the memory portions are formed in the thickness of 20 nm in accordance with the method similar to the first example while using the eight types of the targets described above.

Thereafter, a Pt film is deposited on each film serving as the memory portions using an appropriate mask by the sputtering method, thereby forming a columnar Pt pad having a diameter of 50 μm. A sample thus obtained will be referred to as a sample H1(0.30). Specifically, this reference numeral means "the sample prepared by depositing the film on the substrate H1 by use of the target containing the amount of Zn equal to 0.30".

Thereafter, notches for defining tiny regions are provided on the respective Pt pads, and probes are connected to the notches so as to be conducted to the TiN films. After establishing conduction by attaching other probes to the Pt pads, the samples are subjected to a switching test as ReRAM elements.

A current is fed to the TiN film while applying a voltage up to a maximum of 3 V while using the Pt probe's side as a positive electrode and the TiN film's side as a negative electrode. Hence each sample is subjected to voltage application up to a maximum of 50,000 times. At this time, a favorable switching state is defined as a state where a potential difference between an on-state and an off-state is note less than 1 V on an average of 100 switching operations, and the number of times of voltage application which can maintain the favorable switching state is sought.

In this test, the samples that can maintain the favorable switching state for 50,000 times of voltage application are the samples H1(0.00), H1(0.10), H1(0.30), H1(0.50), and H1(0.70).

On the other hand, none of the films deposited on the substrate H2 can endure 50,000 times of voltage application, regardless of the target used for the deposition.

As described above, in the case of the compositions for which the total number of Zn and Mn is set equal to 3, favorable switching characteristics are obtained particularly when the composition of Zn is set in a range from 0.00 to 0.70. Among them, the samples provided with the improved orientation by applying the H1 substrate of this example realize more favorable switching characteristics.

Second Embodiment

Figure 14:
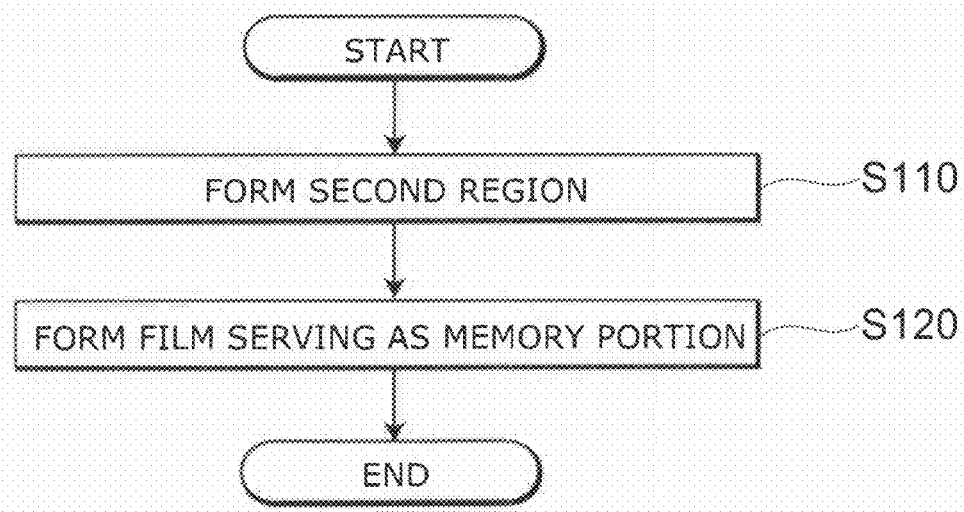
FIG. 14 is flowchart illustrating a method for manufacturing a non-volatile memory device according to a second embodiment.

FIG. 14 is flowchart illustrating a method of manufacturing a non-volatile memory device according to a second embodiment.

The method of manufacturing a non-volatile memory device according to this embodiment is a method of manufacturing the non-volatile memory device which includes: the stacked structure provided with the electrode 111 (the first electrode 110) containing at least any one of metallic elements, Si, Ga, and As and with the memory portion 140 provided on the electrode 111; and the voltage application portion 121 (the second electrode 120) configured to apply the voltage to the memory portion 140 so as to change a resistance in the memory portion to store information.

Now, as shown in FIG. 14, the second regions 320 having a higher content ratio of the nonmetallic element than the first region 310 and having an anisotropic shape on the electrode surface 108 are formed on part of the surface (the electrode surface 108) of the electrode 111 located on the side facing the memory portion 140 while leaving the conductive first region 310 (step S110).

Alternatively, the second regions 320 having a higher content ratio of the nonmetallic element than the first region 310 are formed on part of the surface (the electrode surface 108) of the electrode 111 located on the side facing the memory portion 140 while leaving the conductive first region 310, such that an arrangement interval of the second regions 320 has anisotropy on the plane of the electrode 111 located on the side facing the memory portion 140.

As described previously, formation of the second regions 320 can be achieved by local surface oxidation after providing a resist mask in a predetermined shape, scan ion implantation at a narrow line width, anisotropic radiation of a light beam or an electron ion beam in an oxygen atmosphere, and so forth. In the meantime, in addition to oxidation, it is also possible to anisotropically introduce the principal element (the metallic element 311) constituting at least the near-surface region of the electrode 111 and the substance (the substance serving as the nonmetallic element 321) such as nitrogen, oxygen, fluorine or chlorine, having an electronegativity considerably different from the principal element, to the electrode surface 108 by ion implantation or oxidation (nitridation, fluoridation, and so forth).

Then, the film serving as the memory portion 140 is formed on the first region 310 and the second region 320 (step S120).

Namely, the method is for manufacturing a non-volatile memory device includes a stacked structure and a voltage application portion, the stacked structure including a memory portion and an electrode, the electrode being stacked with the memory portion and containing at least one of a metallic element, Si, Ga, and As, the voltage application portion configured to apply a voltage to the memory portion to change a resistance in the memory portion and store information. The method includes forming a first region and a second region on a surface of a conductive layer serving as the electrode, at least a part of the surface being to face the memory portion, the first region having a conductivity, the second region having a content ratio of nonmetallic element higher than a content ratio of a nonmetallic element in the first region and having an anisotropic shape on the surface. The method further includes forming a layer serving as the memory portion on the first region and the second region.

Alternatively, the method includes forming a first region and a plurality of second regions on a surface of a conductive layer serving as the electrode, at least a part of the surface being to face the memory portion, the first region having a conductivity, each of the second regions having a content ratio of a nonmetallic element higher than a content ratio of a nonmetallic element in a first region, and being arranged in an anisotropic layout on the surface. The method further includes forming a layer serving as the memory portion on the first region and the second regions.

In these methods, the forming the first region and the second region can includes introducing the nonmetallic element to the surface of the conductive layer via a mask having an anisotropic pattern shape. In these methods, the forming the first region and the second region can include radiating at least one of an ion beam, an electron beam, and a light beam onto the surface of the conductive layer.

In this way, there is provided the method of manufacturing a non-volatile memory device having high durability and high performances and being provided with the highly oriented memory portions while maintaining conductivity between the electrodes and the memory portions.

Now, the method of manufacturing a non-volatile memory device according to this embodiment will be described below in terms of a cross point type non-volatile memory device. The following is an example of the method of manufacturing the non-volatile memory device provided with the second regions 320 as exemplified in FIG. 12A.

FIGS. 15A to 15D are process sequence sectional views illustrating the method of manufacturing a non-volatile memory device according to the second embodiment.

Figure 15A:
FIGS. 15A to 15D are sequential schematic cross-sectional views illustrating the method for manufacturing a non-volatile memory device according to the second embodiment.
Figure 15B:
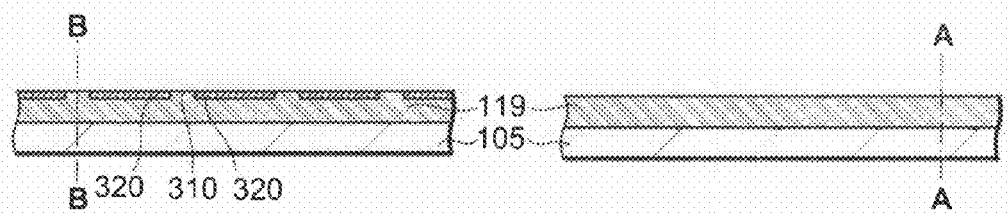
Figure 15C:
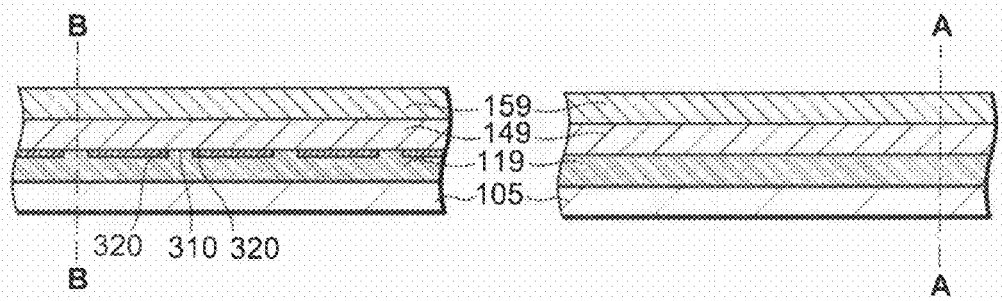
Figure 15D:
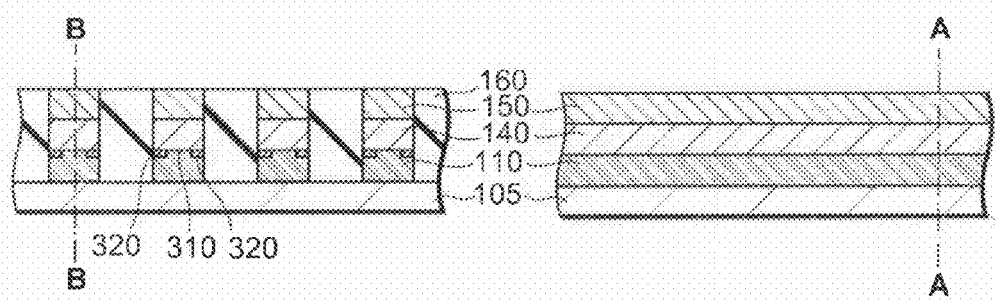
Figure 16A:
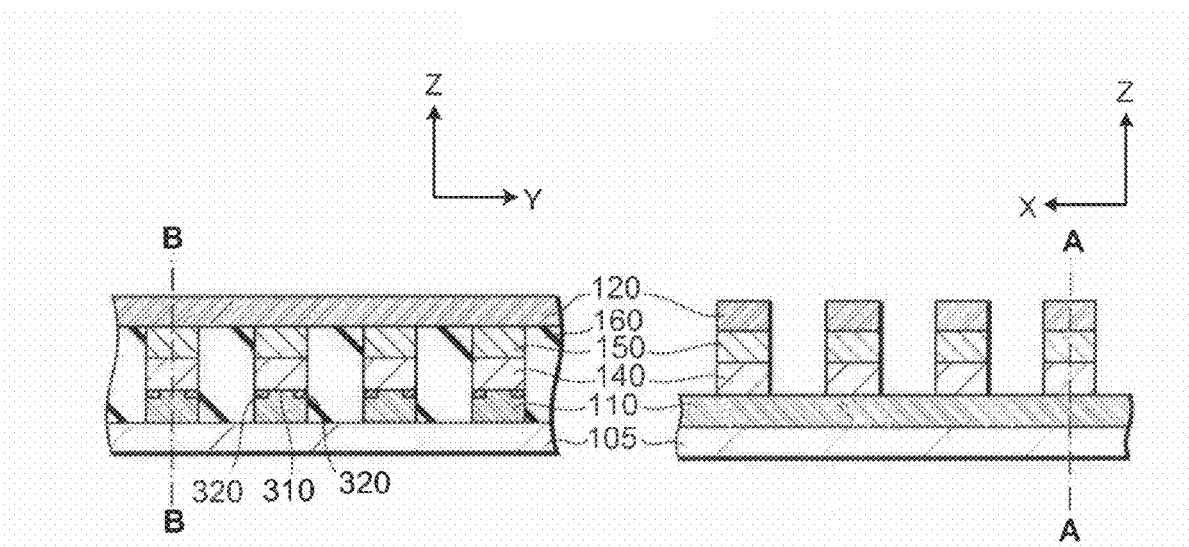
FIGS. 16A and 16B are sequential schematic cross-sectional views following FIG. 15D.
Figure 16B:
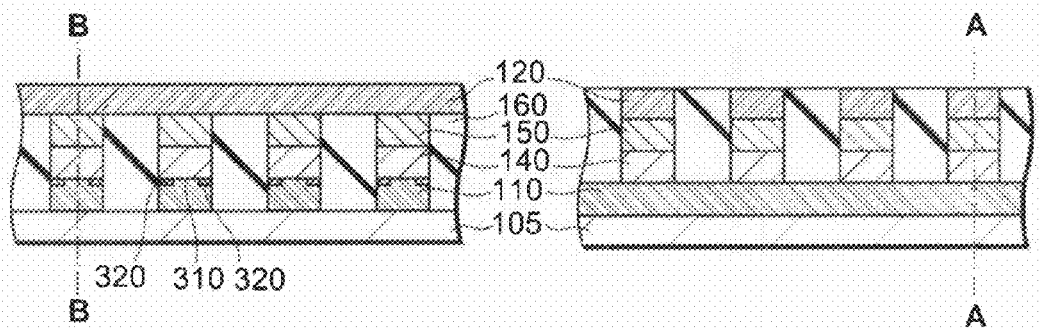

FIGS. 16A and 16B are process sequence sectional views showing processes subsequent to that shown in FIG. 15D.

Moreover, in FIG. 15A to FIG. 16B, diagrams on the left side are cross-sectional views parallel to the y-axis (cross-sectional views taken along an A-A direction in FIGS. 2A and 2B) and diagrams on the right side are cross-sectional views parallel to the x-axis (cross-sectional views taken along a B-B direction in FIGS. 2A and 2B).

As shown in FIG. 15A, a film (a first conductive film 119) serving as the first electrodes 110 is firstly deposited on the substrate 105 made of silicon, and a resist mask 117 of a strip pattern shape having the same pitch as the first electrodes 110 and a line width narrower than the first electrodes 110 is formed thereon. As described previously, the first conductive film 119 is configured to impart conductivity to at least the surface of each of the first electrodes 110, which may apply at least one substance selected from the group consisting of Ti, Ta, Zr, Hf, W, Mo, Ni, Pt, Er, Ir, Ru, Au, Nb, Sr, Si, Ga, and As. Moreover, the first conductive film 119 may also apply an alloy which contains at least two substances selected from this group.

Then, as shown in FIG. 15B, the second regions 320 that are selectively oxidized in the anisotropic shapes are formed on the surface of the first conductive film 119 while leaving the first regions 310 thereon (step S110 in FIG. 14) by oxidizing the first conductive film 119 in the pure oxygen atmosphere at $10 \times 10^5$ Pa and then peeling the resist mask off as described in the first example, for instance. The second regions 320 have a higher content ratio of the nonmetallic element 321 (which is oxygen in this case) than that in the first regions 310.

Thereafter, as described in the first example, a memory portion film 149 serving as the memory portion 140 is deposited thereon in accordance with the PLD method, for instance (step S120 in FIG. 14). The memory portion film 149 is made of $ZnMn_2O_4$, for example, which is deposited at the deposition temperature of 500° C. and in the oxygen atmosphere at $10 \times 10^{-2}$ Pa while setting the laser beam output to 130 mJ/mm$^2$, for example. The film thickness is set to 20 nm, for example. However, the embodiment is not limited only to this configuration and the memory portion film 149 serving as the memory portion 140 can apply any kind of material which shows the resistance change, such as, nickel oxide ($NiO_x$), titanium oxide ($TiO_x$), $Pr_xCa_{1-x}MnO_3$, and the like. In this way, the memory portion film 149 is deposited while being oriented, whereby the orientation of the memory portion 140 is enhanced. Here, a film (a switching element film 159) serving as the switching element 150 is formed after deposition of the memory portion film 149.

Then, as shown in FIG. 15C, the switching element film 159, the memory portion film 149, and the first conductive film 119 are patterned by photolithography and a dry etching process, for example, and a film (an insulator film 169) serving as the insulator 160 is deposited (formed) by CVD (chemical vapor deposition) or a coating method and then a surface thereof is planarized by a CMP (chemical mechanical polishing) method as appropriate. In the above-described process, the films are patterned such that the first electrodes 110 extend in the direction parallel to the x-axis.

Thereafter, as shown in FIG. 16A, a film (a second conductive film 129) for the second electrodes 120 is deposited by sputtering or the CVD method, and then the second conductive film 129, the switching element film 159, the memory portion film 149, and the insulator film 169 are patterned by the photolithography method and the dry etching method, for example. Here, tungsten, tungsten silicide, tungsten nitride, and the like are applicable to the material of the second electrodes 120, for example. Further, at this time, these films are patterned so as to be orthogonal to the patterning direction of the first electrodes 110, i.e., to cause the second electrodes 120 to extend in the y-axis direction.

Then, as shown in FIG. 16B, a $SiO_2$ film, for example, is deposited as the film (the insulator film 169) serving as the insulator 160 by the CVD method or the coating method so as to fill in spaces between the memory portions 140, and then a surface thereof is planarized by the CMP method as appropriate.

In this way, it is possible to form the non-volatile memory device 10 as exemplified in FIGS. 2A to 3C and in FIG. 12A. At this time, as exemplified in FIG. 12A, the second regions 320 have the strip shapes extending along both of the side surfaces of the first electrodes 110. Moreover, the conductive first region 310 remains on a central side of each of the first electrodes 110, so that the first electrodes 110 can be electrically connected to the memory portions 140.

As described above, according to the method of manufacturing a non-volatile memory device of this embodiment, it is possible to provide the method of manufacturing the non-volatile memory device having high durability and high performances and being provided with the highly oriented memory portions while maintaining the conductivity between the electrodes and the memory portions.

Third Embodiment

A third embodiment provides a non-volatile memory device of a probe memory type.

Figure 17:
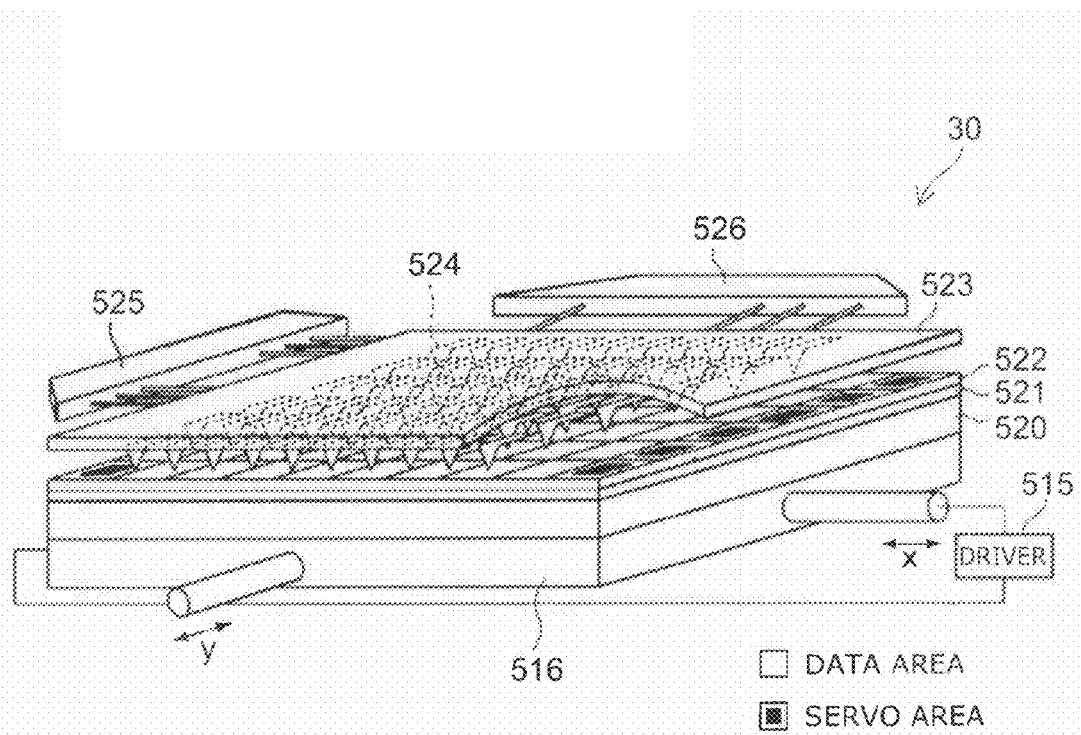
FIG. 17 is a schematic perspective view illustrating the configuration of a non-volatile memory device according to a third embodiment.
Figure 18:
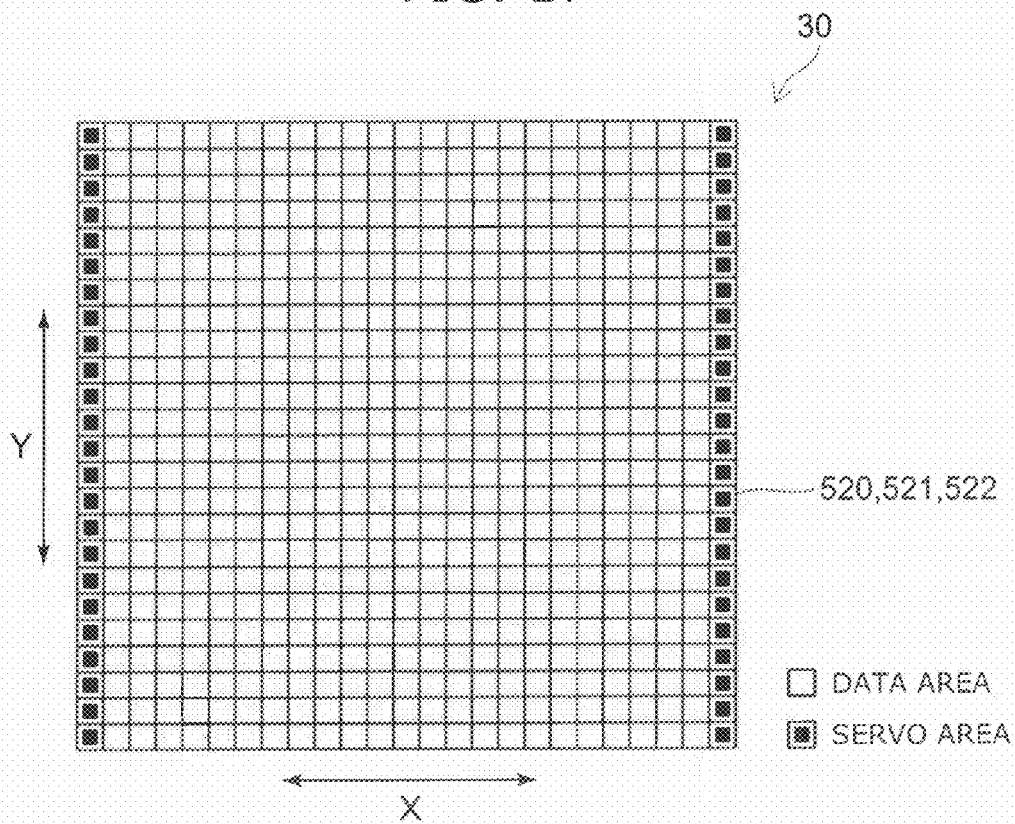
FIG. 18 is a schematic plan view illustrating the configuration of the non-volatile memory device according to the third embodiment.

FIGS. 17 and 18 are a schematic perspective view and a plan view illustrating a configuration of a non-volatile memory device according to the third embodiment.

As shown in FIGS. 17 and 18, in a non-volatile memory device 30 according to the third embodiment, a memory unit 522 provided on an electrode 521 is disposed on an XY scanner 516. Moreover, a probe array is disposed so as to face this memory unit 522.

The probe array includes a substrate 523 and multiple probes (heads) 524 arranged in an array on one surface side of the substrate 523. Each of the probes 524 is formed of a cantilever, for example, and is driven by multiplex drivers 525 and 526.

The multiple probes 524 can be individually operated by use of microactuators inside the substrate 523 or can also be operated altogether so as to access data areas of a memory medium.

First, all the probes 524 are reciprocated in the x direction at a constant cycle by using the multiplex drivers 525 and 526, so that position information in the y direction is read out of servo areas of the memory medium. The position information in the y direction is transferred to a driver 515.

The driver 515 drives the XY scanner 516 based on this position information, moves the memory medium in the y direction, and performs positioning of the memory medium and the probes.

When positioning of these constituents is completed, data are read out of or written into all the probes 524 on the data areas simultaneously and continuously.

The reading and writing of data are continuously executed by reciprocating the probes 524 in the x direction. Moreover, the reading and writing of data are executed for each row of the data areas by sequentially changing the position in the y direction of the memory unit 522.

Here, it is also possible to read the position information out of the memory medium by reciprocating the memory unit 522 in the x direction at a constant cycle and to move the probes 524 in the y direction.

The memory unit 522 is located on the electrode 521 provided on the substrate 520.

The memory unit 522 includes the multiple data areas, and the servo areas disposed on both ends in the x direction of the multiple data areas. The multiple data areas dominate the majority of the memory unit 522.

Servo burst signals are stored in the servo areas. The servo burst signals indicate the position information in the y direction in the data areas.

In addition to this information, address areas for storing address data and preamble areas for obtaining synchronization are disposed inside the memory unit 522.

The data and the servo burst signals are stored in the memory unit 522 in the form of memory bits (electric resistance change). The information in the memory bit representing "1" and "0" is read out by detecting the electric resistance of the memory unit 522.

In this example, one probe (head) is provided so as to correspond to one data area and one probe is provided so as to correspond to one servo area.

The data area includes multiple tracks. The track in the data area is specified by an address signal which is read out of the address area. Meanwhile, the servo burst signal which is read out of the servo area is used for moving the probe 524 to the center of the track to eliminate a read error in reading the memory bit.

Here, it is possible to utilize a head position control technique for a HDD by applying the x direction to a down-track direction and applying the y direction to a track direction.

The non-volatile memory device 30 thus configured includes the electrode 521, a stacked structure provided with the memory unit 522 located on the electrode 521, and the probes 524 serving as the voltage application portion configured to apply the voltage to the memory portion 140 to change a resistance in the memory portion to store information.

Moreover, the surface (the electrode surface 108) of the electrode 521 on the side facing the memory unit 522 having conductivity and including the multiple first regions 310 which contain the element 311 (i.e., at least one of metallic elements, Si, Ga, and As) that exhibits conductivity. Moreover, the electrode surface 108 includes the second regions 320 which contains the metallic element 311 and has the content ratio of the nonmetallic element 321 higher than that in the first regions 310.

Further, as described previously, at least either the first regions 310 or the second regions 320 have an anisotropic shape on the plane of the electrode surface 108.

Alternatively, either the first regions 310 or the second regions 320 are anisotropically arranged. For example, the second regions 320 are arranged such that the arrangement interval thereof has anisotropy in the plane of the electrode surface 108. Specifically, the average arrangement interval of the second regions 320 in the first direction (such as the x-axis direction) is different from the average arrangement interval of the second regions 320 in the second direction (such as the y-axis direction) being different from the first direction.

In this way, the difference in polarity is caused between the metallic element 311 and the nonmetallic element 321 in the second region 320 whereby the polarization pair 330 is generated. Accordingly, it is possible to improve orientation of the film serving as the memory portion 140 to be deposited and formed on the electrode surface 108. Moreover, it is also possible to maintain conductivity as the conductive first region 310 can contact the memory portion 140. As described above, according to the non-volatile memory device 30 of this embodiment, it is possible to provide the non-volatile memory device having high durability and high performances and being provided with the highly oriented memory portions while maintaining conductivity between the electrodes and the memory portions.

In the non-volatile memory device 30 as well, formation of the second regions 320 can be achieved by local surface oxidation after providing a resist mask in a predetermined shape, scan ion implantation at a narrow line width, anisotropic irradiation of a light beam or an electron ion beam in an oxygen atmosphere, and so forth as similar to the first embodiment. In the meantime, in addition to oxidation, it is also possible to anisotropically introduce the principal element (the metallic element 311) constituting at least the near-surface region of the electrode 111 and the substance (the substance serving as the nonmetallic element 321) such as nitrogen, oxygen, fluorine or chlorine having considerably different electronegativity to the electrode surface 108 by ion implantation or oxidation (nitridation, fluoridation, and so forth) as similar to the first embodiment. Specifically, any methods of forming a nonmetallic compound such as oxidation, nitridation, fluoridation or chloridation enable formation of the polarization pairs. Hence any elements are applicable.

Note that the non-volatile memory device 30 of the probe memory type of this embodiment can also apply the above-described method of manufacturing a non-volatile memory device according to the second embodiment.

As described above, according to this embodiment, when the origin of orientation is imparted to the isotropic metal by forming an artificial oxide layer or the like thereon and another oxide layer is deposited thereon, it is possible to form the layer provided with the orientation on the outermost layer by utilizing the self-orientation property of the underlying oxide.

Regarding the orientation, it is possible to impart the orientation to any substance serving as the substance to be deposited irrespective of the underlying metal, as along as the substance is made of a combination of the metal and nonmetal and has the polarity. It is also known that the similar effect is obtained by applying multiple kinds of metal to the underlying metal.

This technique is considered to be useful for memory portions which require microfabrication and are anticipated to serve as post-NAND memories. Accordingly, the technique to form the oriented layer, which has not been required by the conventional NAND memories, is expected to bring about various positive effects including not only stability of performances but also an increase in the number of switching operations by way of reduction in the number of grain boundaries, and so forth.

In addition, it is also possible to deposit a TiN layer or the like on an underlying Ti layer so as to orient the TiN layer artificially in a specific direction. Hence, this technique is considered to be one of techniques expected to expand the range of applications.

As described above, according to the embodiments, it is possible to realize the oriented layer on a metallic base material so as to improve the number of switching operations of a high memory-density non-volatile memory and reproduction device applying the material made of a compound of metal and nonmetal. Hence it is possible to provide the non-volatile memory device having high durability and high performances and being provided with the highly oriented memory portions while maintaining conductivity between the electrodes and the memory portions, and to provide the manufacturing method thereof.

The embodiments of the invention have been described above with reference to certain concrete examples. However, the invention is not limited only to these concrete examples. For example, concerning concrete configurations of the portions constituting the non-volatile memory device and the manufacturing method thereof, any configurations are encompassed by the scope of the invention as long as those skilled in the art are able to embody the invention similarly and to obtain similar effects by selecting such configurations from the publicly known techniques.

Moreover, combinations of two or more constituents in the respective concrete examples within the technically available ranges shall also be included in the scope of the invention as long as such combinations encompass the gist of the invention.

In addition, all non-volatile memory devices and manufacturing methods thereof which can be embodied by appropriate design changes by those skilled in the art based on the non-volatile memory devices and the manufacturing method thereof described above as the embodiments of the invention shall also belong to the scope of the present invention as long as such devices and methods encompasses the gist of the invention.

In addition, it is to be understood that various modified examples and altered examples are possible obvious to those skilled in the art from the teachings of the gist of the invention, and that those modified examples and altered examples shall also belong to the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A non-volatile memory device comprising:
   a stacked structure including a memory portion, and an electrode stacked with the memory portion and having a surface having a portion facing the memory portion; and
   a voltage application portion configured to apply a voltage to the memory portion to cause a change in a resistance in the memory portion to store information,
   the surface including:
      a first region containing at least one constituent selected from a group consisting of a metallic element, Si, Ga, and As, the first region being conductive; and
      a second region containing at least one selected from a group consisting of the metallic element, Si, Ga, and As, the second region having a content ratio of a nonmetallic element higher than a content ratio of the nonmetallic element in the first region, and at least one of the first region and the second region having a shape, a width of the shape in a first direction which is parallel to the surface being larger than a width of the shape in a second direction which is parallel to the surface and perpendicular to the first direction.

2. The device according to claim 1,
wherein the shape on the surface is in a strip shape.

3. The device according to claim 1,
wherein the nonmetallic element includes at least one selected from the group consisting of nitrogen, oxygen, fluorine, and chlorine.

4. The device according to claim 1,
wherein the metallic element includes at least one selected from the group consisting of Ti, Ta, Zr, Hf, W, Mo, Ni, Pt, Er, Ir, Ru, Au, Nb, and Sr.

5. The device according to claim 1,
wherein the electrode extends in a first direction,
the voltage application portion extending a second direction intersecting the first direction,
the memory portion is interposed between the electrode and the voltage application portion,
the electrode functions as one of a word line and a bit line,
the voltage application portion functions as another one of the word line and the bit line.

6. The device according to claim 5,
wherein the second region is disposed in an external region of an intersection where the voltage application portion intersects the electrode.

7. The device according to claim 1,
wherein the voltage application portion includes a probe configured to apply the voltage to the memory portion.

8. A non-volatile memory device comprising:
a stacked structure including a memory portion, and an electrode stacked with the memory portion and having a surface having a portion facing the memory portion; and
a voltage application portion configured to apply a voltage to the memory portion to cause a change in a resistance in the memory portion to store information,
the surface including:
 a first region containing at least one selected from a group consisting of a metallic element, Si, Ga, and As, the first region being conductive; and
 a plurality of second regions containing at least one constituent selected from a group consisting of the metallic element, Si, Ga, and As, the second region having a content ratio of a nonmetallic element higher than a content ratio of the nonmetallic element in the first region, and
an average arrangement interval of the second regions in a first direction which is parallel to the surface being different from an average arrangement interval of the second regions in a second direction which is parallel to the surface and perpendicular to the first direction.

9. The device according to claim 8,
wherein an average of intervals between the second regions in a first direction is different from an average of intervals between the second regions in a second direction being different from the first direction.

10. The device according to claim 8,
wherein the nonmetallic element includes at least one selected from the group consisting of nitrogen, oxygen, fluorine, and chlorine.

11. The device according to claim 8,
wherein the metallic element includes at least one selected from the group consisting of Ti, Ta, Zr, Hf, W, Mo, Ni, Pt, Er, Ir, Ru, Au, Nb, and Sr.

12. The device according to claim 8,
wherein the electrode extends in a first direction,
the voltage application portion extending a second direction intersecting the first direction,
the memory portion is interposed between the electrode and the voltage application portion,
the electrode functions as one of a word line and a bit line,
the voltage application portion functions as another one of the word line and the bit line.

13. The device according to claim 12,
wherein the second region is disposed in an external region of an intersection where the voltage application portion intersects the electrode.

14. The device according to claim 8,
wherein the voltage application portion includes a probe configured to apply the voltage to the memory portion.

15. A non-volatile memory device comprising:
a stacked structure including a memory portion, and an electrode stacked with the memory portion and having an interface facing the memory portion; and
a voltage application portion configured to apply a voltage to the memory portion to cause a change in a resistance in the memory portion to store information,
the interface including:
 a nonmetallic element; and
 at least one constituent selected from a group consisting of a metallic element, Si, Ga, and As,
a polarization length being defined as a distance twice as long as a distance between the metallic element and the nonmetallic element in a polarization pair formed of a pair of the metallic element and the nonmetallic element adjacent to each other on the interface,
a polarization pair region being defined as a region containing another polarization pair existing within a range of the polarization length viewed from an end of the polarization pair,
R (%) being defined as an area ratio of the polarization pair region to the interface,
the memory portion including an orientation improved region provided above the polarization pair region and having an orientation property higher than an orientation property in other region than the orientation improved region,
an outer periphery of the orientation improved region in a plane at a distance of T (nm) above from the interface toward the memory portion being located at a distance not less than 12T outside of an outer periphery of the polarization pair region on the interface, and
an area of the orientation improved region in the plane at the distance of T (nm) being not less than {R+(100−R)/2} (%) of an area of the interface.

16. The device according to claim 15,
wherein the R is not more than 50.

* * * * *